United States Patent [19]
Hashimoto

[11] Patent Number: 5,729,437
[45] Date of Patent: Mar. 17, 1998

[54] ELECTRONIC PART INCLUDING A THIN BODY OF MOLDING RESIN

[75] Inventor: Nobuaki Hashimoto, Suwa, Japan

[73] Assignee: Seiko Epson Corporation, Tokyo, Japan

[21] Appl. No.: 466,020

[22] Filed: Jun. 6, 1995

[30] Foreign Application Priority Data

| Jun. 22, 1994 | [JP] | Japan | 6-140473 |
| Aug. 10, 1994 | [JP] | Japan | 6-188267 |
| Mar. 31, 1995 | [JP] | Japan | 7-100599 |

[51] Int. Cl.⁶ .................... H05K 7/02; H01L 23/04
[52] U.S. Cl. .................... 361/760; 174/260; 174/261; 257/730; 257/787; 257/788; 257/692; 257/698; 361/772; 361/774; 361/777; 361/779; 437/68; 439/219; 439/209
[58] Field of Search .................... 174/52.1, 261, 174/52.4, 260; 257/787, 693, 723, 788, 724, 692, 730, 698, 678, 687; 264/272.1, 272.11, 272.14; 361/728, 772, 760, 779, 774, 777, 783, 820; 439/68; 437/215, 219; 29/841

[56] References Cited

FOREIGN PATENT DOCUMENTS

| 56-2656 | 1/1981 | Japan | 257/787 |
| 62-192649 | 12/1987 | Japan . | |
| 63-213936 | 9/1988 | Japan . | |
| 1-134956 | 5/1989 | Japan | 257/724 |
| 2-81460 | 3/1990 | Japan | 257/693 |
| 3-212960 | 9/1991 | Japan . | |
| 4-179255 | 6/1992 | Japan . | |
| 4-352459 | 12/1992 | Japan . | |

*Primary Examiner*—Donald Sparks
*Attorney, Agent, or Firm*—Loeb & Loeb LLP

[57] ABSTRACT

A leadless package type electronic part, the cost and the size of which can be reduced and which exhibits excellent reliability, and an electronic part material for manufacturing the electronic parts. The electronic part of a leadless package type includes a rectangular substrate having a plurality of external electrodes in the periphery thereof, an element part placed on the surface of the substrate while being electrically connected to the external electrodes, and molding resin for molding the element part onto the surface of the substrate, wherein the surface of the molding resin is formed to be flat, and each side surface of the molding resin is flush, or aligned, with a respective side surface of the substrate.

10 Claims, 14 Drawing Sheets

ELECTRONIC PART INCLUDING A THIN BODY OF MOLDING RESIN

BACKGROUND OF THE INVENTION

1. Field of the Invention

The present invention relates to an electronic part having a printed circuit board, on which an IC chip, an LSI or the like is mounted, for use in personal or industrial electronic apparatuses, and an electronic part material from which a plurality of parts are formed.

2. Description of the Prior Art

In recent years, significant progress in electronic technology has resulted in reductions in size, weight and thickness of a variety of personal and industrial electronic apparatuses, along with improvements in performance. In order to enlarge the circuit scale and to increase the number of electronic parts which can be mounted, increases in mounting density and operation speed have been sought by developing a variety of mounting techniques for connecting the electronic parts, as well as techniques for reducing the thickness of the printed circuit board, for finely patterning the same, for providing multilayer structures and for effecting size reduction in the electronic part.

As a technique for establishing the connection between an IC chip, an LSI or the like and the substrate, a chip-carrier-type electronic part structured as shown in FIG. 14 has been known.

FIG. 14A is a plan view of a chip-carrier type electronic part, when viewed from the upper surface thereof, on which a semiconductor device is mounted. FIG. 14B is a cross sectional view taken along line 14B—14B of FIG. 14A. As shown in FIG. 14B, the electronic part is structured such that a semiconductor device 1 is die-attached, i.e. secured in any suitable manner, to a substrate 6 previously cut to have an outline passing through near the centers of through holes 7. Furthermore, the semiconductor device 1 and circuit patterns 3 formed on the substrate 6 are electrically connected to one another by wires 2. The circuit patterns 3 are connected to the through holes (the external electrodes) 7 and, via those electrodes, to connection lands 8 formed on the reverse, or bottom, side of the substrate 6. Furthermore, connections between the circuit patterns 3 and a mother board (not shown) are established, usually by soldering, via the through holes 7 and the connection lands 8. Although the substrate 6 is usually a printed circuit board, a ceramic substrate is sometimes employed. The semiconductor device 1 which is die-attached to the substrate 6 is connected to the circuit patterns 3 by wire bonding, followed by being encapsulated by molding in a molding resin mass 5.

A molding frame 4 constituting a dam is formed in the periphery of the surface of the substrate 6, the molding frame 4 allowing the level of molding resin 5 to rise to the level of the semiconductor device 1. Furthermore, undesirable flow of the molding resin 5 from the through holes 7 into the reverse side of the substrate 6 can be prevented. If the molding frame 4 is not used, the substrate 6 is so designed as to locate the through holes 7 away from the semiconductor device 1 for the same reason. Furthermore, the molding resin 5 of a type exhibiting excellent thixotropy (having a high thixotropic ratio, that is, resin flow is limited) has been employed.

However, the foregoing conventional chip-carrier type electronic part encounters a problem in that the molding frame 4 must be formed on the substrate 6 and, thus, the cost for forming the molding frame 4 cannot be reduced. Another problem is that the molding frame 4 causes the size of the chip-carrier-type electronic part to be enlarged excessively.

In a case where a molding frame 4 is not used, the necessity for locating through holes 7 away from semiconductor device 1 causes the size of the chip-carrier type electronic part to be enlarged undesirably. Furthermore, since the molding resin 5 must have excellent thixotropy, that is a molding material having a poor fluidity must be used, the molding resin 5 cannot easily be introduced into gaps adjacent to the semiconductor device 1. As a result, there arises a problem resulting from the creation of portions which are not filled with the molding resin 5, and thus the reliability of the chip-carrier-type electronic part deteriorates.

SUMMARY OF THE INVENTION

Accordingly, an object of the present invention is to provide a leadless package type electronic part, which is capable of overcoming the foregoing problems, the cost and the size of which can be reduced and which exhibits excellent reliability, as well as an electronic part material for manufacturing the electronic parts, and a method for mounting the electronic part.

The above and other objects according to the invention relate particularly to electronic parts mounted on a substrate, which parts include, in the concept thereof, active devices, represented by a semiconductor device, and passive devices, represented by inductance devices and capacitive devices.

One type of electronic part according to the invention is an electronic part of a leadless package type comprising: a rectangular substrate having a plurality of external electrodes at the periphery thereof; an element part placed on the surface of the substrate while being electrically connected to the external electrodes; and molding resin for molding the element part onto the surface of the substrate, wherein the surface of the molding resin is formed to be flat, and each side surface of the molding resin and each side surface of the substrate have the same surface.

It is preferable that an electronic part of the type described above have a structure such that the external electrodes are formed by cutting through holes in the axial direction of the through holes.

It is preferable that the electronic part have a structure such that the external electrodes are filled with conductive paste or metal material that has solderability.

It is preferable that the electronic part have a structure such that the metal material is solder or gold.

It is preferable that the electronic part further comprise a covering member for covering openings of the external electrodes formed adjacent to the molding resin, wherein the covering member is, by the molding resin, molded onto the surface of the substrate, and the side surfaces of the covering member are formed to have the same surface with each side surface of the molding resin and the substrate.

It is preferable that the electronic part further comprise a pad disposed between the substrate and the element part and made of the same material as that of the covering member.

It is preferable that the electronic part have a structure such that the pad has a penetrating hole that penetrates the covering member, with a conductive member for conducting the element part and a circuit region of the substrate to each other being included in the penetrating hole.

It is preferable that the electronic part have a structure such that the covering member is an adhesive sheet, a dry film, a glass epoxy plate or a ceramic plate.

It is preferable that the electronic part have a structure such that the external electrodes are disposed at the corners of the substrate.

An electronic part material according to the invention comprises a substrate material having through holes disposed on lattice-like imaginary lines, the through holes being cut at lines passing through substantially the centers thereof to form external electrodes; element parts mounted on regions of the substrate material surrounded by the imaginary lines; and molding resin introduced into the entire surface of the substrate material to mold the element parts.

It is preferable that the electronic part material further comprise dams disposed in the periphery of the substrate material to prevent discharge of the introduced molding resin.

It is preferable that the electronic part material further comprise plating leads provided for the substrate material and connected to the corresponding through holes.

It is preferable that the electronic part material have a structure such that the plating leads are disposed on the two sides of the substrate material.

It is preferable that the electronic part material have a structure such that conductive paste or metal material having solderability is filled in each of the through holes.

It is preferable that the electronic part material have a structure such that the metal material is solder or gold.

It is preferable that the electronic part material further comprise a covering material placed on the surface of the substrate material to cover an opening portion of each of the through holes, the covering material being molded by the molding resin.

It is preferable that the electronic part material further comprise pads disposed between the substrate material and each element part and made of the same material as that of the covering material.

It is preferable that the covering material be an adhesive sheet, a dry film, a glass epoxy plate or a ceramic plate.

It is preferable that the electronic part material have a structure such that the through holes are formed at intersection portions of lattice-like imaginary lines.

A method of manufacturing electronic parts according to the invention comprises: a substrate manufacturing step for forming through holes in a substrate material along lattice-like imaginary lines, the through holes being caused to have external electrodes formed by cutting the through holes along centers thereof; a mounting step for mounting element parts in regions of the substrate material surrounded by the imaginary lines; a connection step for establishing the electrical connection among the element parts and the corresponding through holes; a molding step for introducing molding resin into the entire surface of the substrate material to mold the element parts; and a cutting step for cutting the substrate material, the molding resin and the through holes along the imaginary lines after the molding resin has been hardened.

It is preferable that the above method of manufacturing electronic parts further comprise a dam forming step for forming dams in the periphery of the substrate material to prevent discharge of the introduced molding resin prior to performing the molding step.

It is preferable that in the above method of manufacturing electronic parts, a jig for horizontally holding the substrate material is used, and the molding resin is hardened in a state where the substrate material is held horizontally by the jig.

It is preferable that in the above method of manufacturing electronic parts, the molding resin to be introduced is controlled by weight.

It is preferable that the above method of manufacturing electronic parts further comprise an injection step for injecting conductive paste into each of the through holes prior to performing the molding step.

It is preferable that in the above method of manufacturing electronic parts, the injection step is performed such that the conductive paste is injected into each of the through holes, and then the conductive paste is heated and hardened.

It is preferable that the above method of manufacturing electronic parts further comprise an injecting step for injecting metal material having solderability into each of the through holes prior to performing the molding step.

It is preferable that in the above method of manufacturing electronic parts, the metal material is solder, and the injecting step is performed such that soldering paste is injected into each of the through holes, and then the soldering paste is heated and melted.

It is preferable that in the above method of manufacturing electronic parts, the metal material is solder, and the injecting step is performed such that opening portions of the through holes are brought into contact with the solder which has been melted and caused to wave.

It is preferable that in the above method of manufacturing electronic parts, the metal material is solder, and the injecting step is performed such that portions of the substrate material except opening portions of the through holes are masked, and then the substrate material is immersed in molten solder.

It is preferable that in the above method of manufacturing electronic parts, the injecting step is performed such that thick plating is applied to the through holes.

It is preferable that the method of manufacturing electronic parts further comprise: a closing step, using a closing member, for closing an opening portion of each of the through holes opened in the reverse surface of the substrate material prior to performing the molding step; and an opening step for removing the closing member after the molding resin has been hardened.

It is preferable that in the above method of manufacturing electronic parts, the closing member is a non-adhesive flat member that is capable of covering the entire surface of the reverse side of the substrate material, and the closing step is performed such that the flat member is pressed against the reverse side of the substrate material.

It is preferable that in the above method of manufacturing electronic parts, the flat member is made of silicon rubber.

It is preferable that in the above method of manufacturing electronic parts, the closing member is an adhesive sheet that is capable of covering the entire surface of the reverse side of the substrate material, and the closing step is performed by applying and bonding the adhesive sheet to the reverse side of the substrate material.

It is preferable that in the above method of manufacturing electronic parts, the sheet is an ultraviolet hardening sheet, the adhesive property of which deteriorates when irradiated with ultraviolet rays, and the ultraviolet hardening sheet is irradiated with ultraviolet rays between the closing step and the opening step.

It is preferable that in the above method of manufacturing electronic parts, the sheet is a thermosetting sheet, the adhesive property of which deteriorates when heated, and the thermosetting sheet is heated between the closing step and the opening step.

It is preferable that in the above method of manufacturing electronic parts, the closing member is made of soluble resin that is dissolved in an alkali water solution, the closing step is performed such that the soluble resin is introduced into and hardened in each of the through holes, and the opening step is performed such that the soluble resin is washed off with an alkali water solution.

It is preferable that the method of manufacturing electronic parts further comprises a covering step for attaching, to the surface of the substrate material, a covering material for closing the opening portion of each of the through holes prior to performing the molding step.

It is preferable that in the above method of manufacturing electronic parts, the covering material is an adhesive sheet, and the covering step is performed such that the adhesive sheet is applied and bonded to the surface of the substrate material.

It is preferable that in the above method of manufacturing electronic parts, the covering member is a dry film, and the covering step is performed such that the dry film is applied and bonded to the surface of the substrate material.

It is preferable that in the above method of manufacturing electronic parts, the covering member is a glass epoxy molded plate, and the covering step is performed such that the molded plate is bonded to the surface of the substrate material.

It is preferable that in the above method of manufacturing electronic parts, the covering member is made of glass epoxy prepreg, and the covering step is performed such that the prepreg is, with heat, forcibly applied to the surface of the substrate material.

It is preferable that in the above method of manufacturing electronic parts, the covering member is a ceramic molded plate, and the covering step is performed such that the molded plate is bonded to the surface of the substrate material.

It is preferable that in the above method of manufacturing electronic parts, the covering member is a ceramic green sheet, and the covering step is performed such that the green sheet is, with heat, forcibly applied to the surface of the substrate material.

It is preferable that the method of manufacturing electronic parts according to the invention further comprise the steps of: attaching, to the substrate material, flatness-maintaining means for maintaining the flatness of the substrate material prior to performing the molding step; and removing the flatness-maintaining means prior to performing the cutting step and as well as after the molding resin has been hardened.

It is preferable that in the above method of manufacturing electronic parts, the substrate material is heated and then gradually cooled prior to removing the flatness-maintaining means and as well as after the molding resin has been hardened.

It is preferable that the method of manufacturing electronic parts according to the invention further comprise the steps of: attaching, to the substrate material, flatness-maintaining means for maintaining the flatness of the substrate material prior to performing the cutting step and as well as after the molding resin has been hardened; heating and gradually cooling the substrate material; and removing the flatness-maintaining means.

It is preferable that in the above method of manufacturing electronic parts, the flatness-maintaining means comprises a flatness maintaining plate that is placed on the reverse side of the substrate material, and a holding member for holding both the flatness maintaining plate and the substrate material.

It is preferable that in the above method of manufacturing electronic parts, the through holes and plating leads connected to the corresponding through holes are integrally formed on the substrate material in the substrate manufacturing step.

It is preferable that the method of manufacturing electronic parts further comprise: a semi-cutting step for semi-cutting the substrate material and the molding resin to separate the plating leads from the through holes prior to performing the cutting step; and an inspection step for electrically inspecting the element parts.

It is preferable that in the above method of manufacturing electronic parts, the semi-cutting in the semi-cutting step is performed along the imaginary lines.

It is preferable that the method of manufacturing electronic parts according to the invention further comprise the step of: applying and bonding an adhesive sheet to the entire surface of either side of the substrate material prior to performing the cutting step, wherein the cutting step is performed such that the sheet is not completely cut.

For molding an electronic part according to the invention, the surface of the molding resin having a flat shape enables the total thickness to be equal. Since each side surface of the molding resin has the same surface with each side surface of the substrate, the space can be used efficiently because a dam or the like can be omitted. Therefore, the area of the overall plane shape can be reduced.

In electronic parts according to the invention, the external electrodes are formed by cutting through holes in the axial direction of the through holes. If solder or the like is not filled in the external electrodes or the like, use of the external electrodes as the holes for locating a probe pin facilitates an electrical inspection.

According to certain embodiments of electronic parts according to the invention, the external electrodes are filled with the conductive paste or the metal material having solderability so that handling easiness is improved. In a case where the external electrodes are soldered to a mother board or the like, fillets can easily be formed in the lower portions of the external electrodes adjacent to the mother board. Thus, soldering can easily be performed. Furthermore, the molding resin is not introduced into the external electrodes in the molding step, thus resulting in manufacturing being performed easily. In addition, members corresponding to the conventional dams can be omitted from the structure. Furthermore, the element parts and external electrodes are disposed closely. As a result, the manufacturing cost can be reduced and a compact overall shape can be realized. Furthermore, a molding material having low thixotropy, that is, exhibiting easy introduction capability can be used.

In an electronic part according to the invention, solder or gold can be used as the metal material so that ease of soldering to the mother board is further improved.

An electronic part according to the invention can comprise a covering member for covering openings of the external electrodes formed adjacent to the molding resin, wherein the side surfaces of the covering member are formed to have the same surface with each side surface of the molding resin and the substrate. Therefore, introduction of the molding resin into the external electrodes in the molding step can be prevented. Thus, the manufacturing cost can be reduced, and a compact overall shape can be realized. Furthermore, a molding material having low thixotropy can be used.

In an electronic part according to the invention the pad disposed between the substrate and the element part can be made of the same material as the covering member. Thus, the pad can be used as the locating reference at the time of mounting the element parts. Furthermore, a problem of a type that an end of the element part is placed on the covering member, and thus the element part is mounted while being inclined undesirably, can be prevented.

If the electronic part has the structure that the pad has a penetrating hole, and a conductive member is included in the penetrating hole, the element part requiring a die pad and the die pad can be electrically conducted to each other so that their potentials are made to be the same.

In electronic parts according to the invention, the covering member can be an adhesive sheet, a dry film, a glass epoxy plate or a ceramic plate so that machining and attaching are easily performed. In particular, a photoprocess for use in the process for manufacturing a substrate can be applied to the dry film or the like. Therefore, machining and attaching can be performed more easily.

If an electronic part according to the invention comprises external electrodes at the corners of the substrate thereof, the printed patterns of the substrate can be disposed while being dispersed. Therefore, the corners of the substrate, that easily become dead spaces, can be used efficiently. Therefore, the printing pattern can be made adequately, and a compact overall shape can be realized because the dead space can be eliminated.

Electronic part material according to the invention can be cut along the imaginary lines so that leadless type electronic parts, each comprising the substrate having external electrodes in the periphery thereof, are formed, on which an element part is mounted and molded. The electronic part obtained by cutting has a structure that each side surface of the molding resin and each side surface of the substrate have the same surface so that electronic parts similar to those described above. In the foregoing case, although the electronic part material may be of a type from which one electronic part can be obtained by cutting, it is preferable that the electronic part material be of a type in which a multiplicity of electronic part elements are included in a lattice configuration to enable a multiplicity of electronic parts to be obtained by cutting. Thus, compact electronic parts can be easily and quickly manufactured.

Electronic part materials according to the invention can comprise the dams in the periphery of the substrate material thereof so that discharge of the molding resin from the substrate material is prevented in the molding step. Therefore, introduction (application) of the molding resin can be performed efficiently, and molding material having low thixotropy can be used.

Electronic part material according to the invention can further comprise the plating leads so that a plurality of electronic part elements can be simultaneously applied with plating. Since the electronic part elements are concentrically disposed, plating can be performed uniformly and efficiently.

When electronic part material according to the invention can has the plating leads disposed on the two sides of the substrate material, local flow of the plating electric current can be prevented, and thus the thickness of plating can be equalized over the entire surface.

When electronic part material according to the invention has the structure that conductive paste or the metal material having solderability is filled in each of the through holes, the metal material can be collectively injected into a plurality of electronic part elements by a printing process or a plating process used in the technology for manufacturing substrates.

In the molding step, undesirable introduction of the molding resin into the through holes can be prevented, and therefore manufacturing can easily be performed. Furthermore, the through holes (the external electrodes) of the electronic part obtained by cutting are filled with the foregoing metal material. Thus, electronic parts similar to those described earlier herein can be manufactured.

When electronic part material according to the invention comprises solder or gold as the metal material, electronic parts obtained by cutting exhibit excellent soldering ease, as described earlier herein.

Electronic part material according to the invention can comprise a covering material placed on the surface of the substrate material to cover an opening portion of each of the through holes. Therefore, covering materials can collectively be provided for a plurality of electronic part elements. Furthermore, undesirable introduction of the molding resin into the through holes can be prevented in the molding step, and therefore manufacturing can be performed easily. Moreover, the electronic parts obtained by cutting can be made to be similar to parts described earlier herein.

If electronic part material according to the invention comprises pads disposed between the substrate material and each element part and made of the same material as that of the covering material, pads can easily be attached, and the yield can be improved. Furthermore, the electronic parts obtained by cutting can be made to be similar to parts described earlier herein.

Electronic part material according to the invention can have a covering material which is an adhesive sheet, a dry film, a glass epoxy plate, or a ceramic plate. Therefore, machining and attaching can easily be performed, and the electronic parts obtained by cutting can be made to be similar to parts described earlier herein.

If electronic part material according to the invention has through holes formed at intersection portions of lattice-like imaginary lines, the electronic parts obtained by cutting can be made to be similar to electronic parts described earlier herein in which the through holes (the external electrodes) formed at the corners of the substrate.

At least one method of manufacturing electronic parts according to the invention causes the molding resin to be hardened through the substrate manufacturing step, the mounting step, the connection step and the molding step. This will allow the fabrication of an electronic part material comprising: a substrate material having through holes disposed on a lattice-like imaginary lines, the through holes being cut at lines passing through substantially the centers thereof to form external electrodes; element parts mounted on regions of said substrate material surrounded by the imaginary lines; and molding resin introduced into the entire surface of the substrate material to mold the element parts.

Furthermore, the following cutting step enables electronic parts in external electrodes are formed by cutting through holes in the axial direction of said through holes to be obtained by cutting. Therefore, prior forming of a multiplicity of the electronic part elements on the electronic part material will enable a multiplicity of electronic parts to be manufactured collectively. Furthermore, cutting causes each electronic part to have the same surface consisting of the side surface of the molding resin and the side surface of the substrate. Note that the cutting positions (lines) may be on the imaginary lines or slightly deviated from the imaginary lines if cutting is performed along the imaginary lines. Although it is preferable that the cutting method be dicing, breaking or the like may be employed.

In certain methods of manufacturing electronic parts according to the invention, dams are formed in the periphery of the substrate material to prevent discharge of the introduced molding resin prior to performing the molding step. Thus, discharge of the molding resin to the outside of the substrate material can be prevented, and therefore introduction (application) of the molding resin can be performed efficiently. In addition, molding material having low thixotropy can be used. Furthermore, the molding resin can be applied uniformly.

In certain methods of manufacturing electronic parts according to the invention, a jig is used and the molding resin is hardened in a state where the substrate material is held horizontally so that the molding resin can be applied more equally.

In certain methods of manufacturing electronic parts according to the invention, the molding resin to be introduced is controlled by weight. Therefore, as compared with the conventional method in which the molding resin has been controlled by the time of discharge from a supply apparatus, the thickness accuracy of the molding resin can significantly be improved. It leads to a fact that the thicknesses of the electronic parts can be controlled accurately.

In certain methods of manufacturing electronic parts according to the invention, conductive paste is injected into the through holes prior to performing the molding step. Thus, an electronic part material according to the invention can be manufactured. By cutting the electronic part material, electronic parts according to the invention can be manufactured.

Since a method of manufacturing electronic parts according to the invention, has the arrangement that the metal material having solderability is injected into the through holes prior to performing the molding step, an electronic part material in metal material having solderability which is filled in each of said through holes can be manufactured, as can corresponding electronic parts according to the invention.

In certain methods of manufacturing electronic parts according to the invention, solder paste is injected into the through holes, and then the solder paste is heated and melted so that the through holes are filled with solder. With the foregoing method, the substrate manufacturing technology using a stencil or a dry film can be applied so that injection of the solder can accurately and easily be performed.

In certain methods of manufacturing electronic parts according to the invention, opening portions of the through holes are brought into contact with the solder which has been melted and caused to wave. As a result, the solder is introduced into the through holes due to a capillary phenomenon so as to be injected into the same. With the foregoing method, solder can quickly be injected, and the solder for mounting the electronic part onto a mother board can be previously supplied to the electronic part. In certain methods of manufacturing electronic parts according to the invention, the substrate material is masked, and then the substrate material is immersed in molten solder. As a result, the solder is introduced in and fills only the through holes. The foregoing method enables the solder to be injected accurately and easily. By also employing the method in which an injecting step is performed such that opening portions of said through holes are brought into contact with said solder which has been melted and caused to wave, the solder can be injected accurately and quickly.

In certain methods of manufacturing electronic parts according to the invention, the through holes are plated thickly so that the through holes are filled with the solder and a state is realized in which the through holes are filled with the plating material. The foregoing method enables a plating process for printing a pattern on the substrate material to be employed simultaneously. As a result, injection of the solder can significantly easily be performed.

Certain methods of manufacturing electronic parts according to the invention, comprise a closing step, using a closing member, for closing an opening portion of each of the through holes opened in the reverse surface of the substrate material prior to performing the molding step; and an opening step for removing the closing member after the molding resin has been hardened. Therefore, air in each through hole is enclosed in the molding step to prevent undesirable introduction of the molding resin into the through holes. Therefore, covering members and injecting members, that are integrated with the electronic part, are not used to prevent introduction of the molding resin into the through holes.

In certain methods of manufacturing electronic parts according to the invention, the closing step is performed such that the flat member is abutted to cover the entire surface of the reverse side of the substrate material. Thus, closing of all through holes can be performed collectively, and the opening step can be performed with particular ease. By using a silicon rubber flat member as the flat member at this time, close contact can be maintained even if the temperature is changed. Thus, a problem, such as undesirable discharge of enclosed air, can be prevented.

In certain methods of manufacturing electronic parts according to the invention, the closing member comprises the adhesive sheet capable of covering the entire surface of the reverse side of the substrate material. Thus, desired close contact can be maintained without a necessity of pressing the adhesive sheet. As a result, the adhesive sheet can easily be attached to the substrate material.

In certain methods of manufacturing electronic parts according to the invention, the sheet is one having an adhesive property which deteriorates with ultraviolet rays or heat. Thus, irradiation of the sheet with ultraviolet rays or heating of the same after the molding resin has been hardened enables the sheet to be separated easily even if the sheet has strong adhesiveness.

In certain methods of manufacturing electronic parts according to the invention, the closing member is made of resin introduced into and hardened in each through hole, the resin being resin that is dissolved in an alkali water solution. Therefore, washing with an alkali water solution after the molding resin has been hardened, preferably after the cutting step has been performed, enables the closing member to be removed easily and completely from the electronic part.

In certain methods of manufacturing electronic parts according to the invention, the covering material for closing the through holes is attached to the surface of the substrate material prior to performing the molding step. Thus, an electronic part material according to the invention can be formed after the molding resin has been hardened. Furthermore, a subsequent cutting step enables electronic parts according to the invention to be manufactured.

In certain methods of manufacturing electronic parts according to the invention, the covering material is the adhesive sheet, the dry film, the glass epoxy molded plate or the ceramic molded plate. Thus, machining and attaching can easily be performed. Furthermore, the electronic parts according to the invention, obtained by cutting, can be made by this process. By using glass epoxy prepreg or a ceramic green sheet and by heating and forcibly applying the same to be the covering material, machining can be performed relatively easily.

In certain methods of manufacturing electronic parts according to the invention, a flatness-maintaining means for maintaining the flatness of the substrate material is attached prior to performing the molding step. Thus, warping of the substrate material due to the difference in coefficient of thermal expansion between the molding resin and the substrate material when the molding resin is hardened can be relaxed. As a result, the electronic parts obtained by cutting are free from warp and have excellent soldering easiness.

In certain methods of manufacturing electronic parts according to the invention, the substrate material is again heated and then gradually cooled together with the hardened molding resin prior to removing the flatness-maintaining means. As a result, a relaxing phenomenon (the creeping phenomenon) due to the viscous component of the molding resin can be generated. Thus, warping of the substrate material can further be reduced. If the flatness-maintaining means is attached after the molding resin has been hardened, followed by heating and gradually cooling the substrate material, the creeping phenomenon can be generated.

In certain methods of manufacturing electronic parts according to the invention, the flatness-maintaining means comprises a flatness maintaining plate and a holding member for holding both the flatness maintaining plate and the substrate material. Therefore, the flatness of the substrate material can be maintained, and the flatness-maintaining means does not interrupt the molding process. If the holding member is formed into a frame shape, the foregoing dam function is realized. The flatness maintaining plate may serve as a flat member.

Certain methods of manufacturing electronic parts according to the invention, enable an electronic part material according to the invention to be formed by previously integrating the plating leads with the substrate material. Thus, a plurality of electronic part elements can collectively be applied with plating.

In certain methods of manufacturing electronic parts according to the invention, the plating leads are, by half cutting, separated from the through holes prior to performing the cutting step, followed by performing electrical inspection of the element parts. Thus, the electronic part elements can be made electrically independent in the state of the electronic part material. As a result, each electronic part element can be inspected in the foregoing state. Therefore, the inspection process can be simplified.

In certain methods of manufacturing electronic parts according to the invention, semi-cutting is performed along the imaginary lines. Therefore, the cutting lines in the semi-cutting step and the complete cutting lines in the cutting step can be made to be the same. Thus, cutting can be performed efficiently.

In certain methods of manufacturing electronic parts according to the invention, the adhesive sheet is applied to the entire surface of either side of the substrate material prior to performing the cutting step. Thus, dispersion of the cut electronic parts can be prevented similar to the process for dicing semiconductor wafer. As a result, a post process can be performed easily.

Other and further objects, features and advantages of the invention will be appear more fully from the following description.

DESCRIPTION OF THE PREFERRED EMBODIMENTS

Preferred embodiments of the present invention will now be described with reference to the drawings.

Figure 1A:
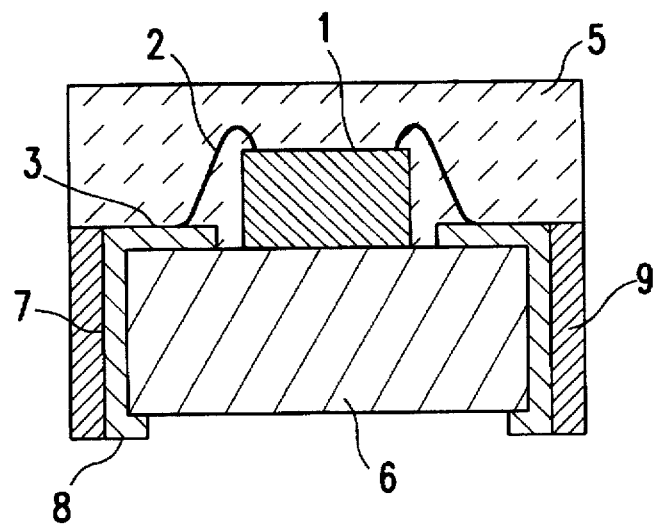
FIGS. 1A and 1B are, respectively, a cross-sectional elevational view and a cross-sectional plan view of an electronic part according to an embodiment of the present invention.
Figure 1B:
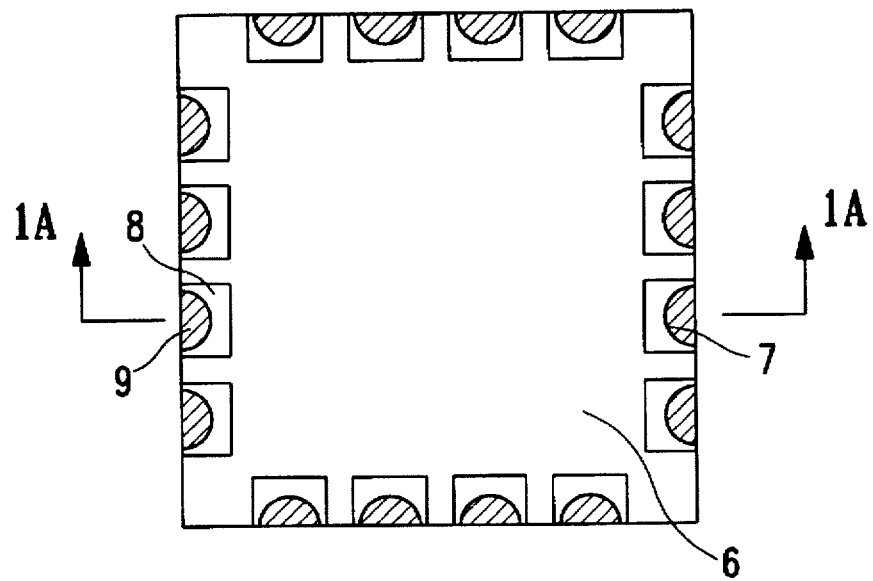

FIGS. 1A and 1B are structural views of a chip-carrier type (a leadless package type) electronic part according to an embodiment of the present invention. FIG. 1B is a bottom plan view of the chip-carrier-type electronic part. FIG. 1A is a cross sectional view taken along line 1A—1A of FIG. 1B.

As shown in FIG. 1A, the electronic part is structured such that a semiconductor device 1 is die-attached to a substrate 6. Substrate 6 has been cut to have side edges which pass near the centers of through holes 7. Furthermore, the semiconductor device 1 and circuit patterns 3 formed on the top surface of substrate 6 are electrically connected to one another by wires 2.

Although semiconductor device 1 is shown here as the element part, the element part may also be one or more passive devices, such as an inductive device and/or a capacitive device, as well as any type of active device, such as an IC, LSI or the like. Any device that is placed on a substrate may constitute semiconductor device 1.

Each through hole 7 is shown in the drawings to have a rectangular cross section and is formed as a notch in a peripheral edge of substrate 6. Each through hole 7 could have a cross section other than rectangular. Conductive material is deposited on the walls of each through hole 7 and as circuit patterns 3 on the top surface of substrate 6 and lands 8 on the bottom surface of substrate 6. The conductive material in through holes 7 thus provides conductive paths between each circuit pattern 3 and an associated circuit pattern 8. The conductive material in through holes 7 and patterns 3 and 8 are most commonly metallization formed by plating.

At least some of circuit patterns 3 serve as bonding pads for wire bonding of wires 2. The circuit patterns 3 are, by way of the through holes 7, connected to connection lands 8, forming external electrodes. Thus, circuit patterns 3 are connected to a mother board (not shown), via the metallization in through holes 7 and the connection lands 8, by soldering.

In the embodiment of FIGS. 1A and 1B, through holes 7 are filled with solder strips 9 which will easily form solder fillets (solder hems) of the through holes 7 on the side surfaces of the electronic part, i.e at the side surfaces of substrate 6. As a result, the reliability of the electronic part can be improved as known, and the visual inspections to be performed during a process of mounting the electronic part can easily be conducted.

Although the substrate 6 is usually a printed circuit board, a ceramic substrate is sometimes used. A molding resin 5 is, by a method to be described later, cut to have the same outline as that of the substrate 6. The die-attachment of the semiconductor device 1 is usually effected by an epoxy adhesive agent or silver paste. The wires 2 are usually gold wires or aluminum wires which are connected by a known wire bonding method. In a case where the substrate 6 is a printed circuit board, the conductive material in the walls of holes 7 can be formed of a patterned copper foil which is gold plated. In the case of a ceramic substrate, the circuit patterns 3 usually have a structure such that copper, silver or tungsten paste is gold plated or are made of gold paste. In the foregoing case, the through holes 7 are, similarly to the printed circuit board, nickel or gold plated on plated copper. As an alternative to this, the through holes 7 may be filled with the foregoing conductive paste.

In the foregoing case, the material of the conductive paste may be a material containing copper, silver, gold or the like. In a particular case where an organic substrate is used as the substrate 6, it is preferable that a material containing copper be used as the material of the conductive paste from the viewpoint that its baking temperature is low. It is more preferable that conductive paste of a type such that copper particles are silver plated be used.

Figure 2A:
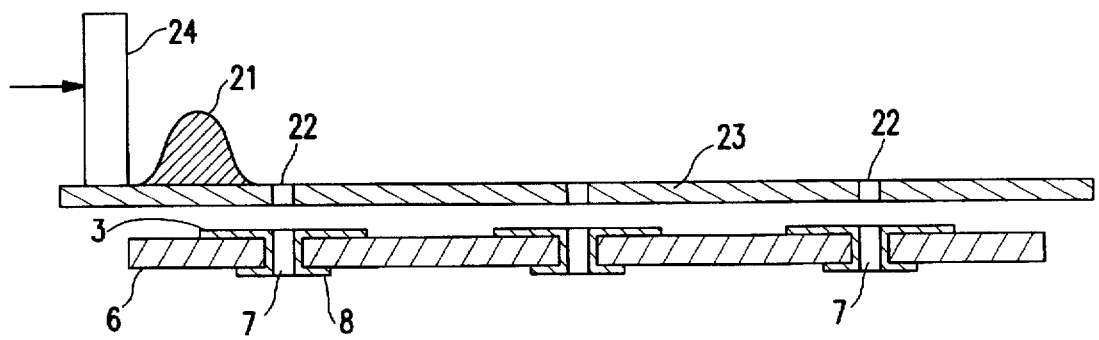
FIGS. 2A, 2B and 2C are side elevational cross-sectional views showing three stages in the performance of a method according to the invention for fabricating the embodiment shown in FIGS. 1A and 1B.

The conductive paste is placed by a method comprising the steps of filling the through holes 7 with the conductive paste with the aid of a squeegee 24, as shown in FIG. 2A; heating the conductive paste to a molten state so that proper solder fillets can be formed; and then allowing the molten solder material to harden, similarly to the method for the solder 9 shown in FIG. 2.

Although the through holes 7 are filled with the solder 9 in this embodiment, any material having solderability may be used. For example, gold or the like may be enclosed or conductive paste may be enclosed.

Figure 2B:
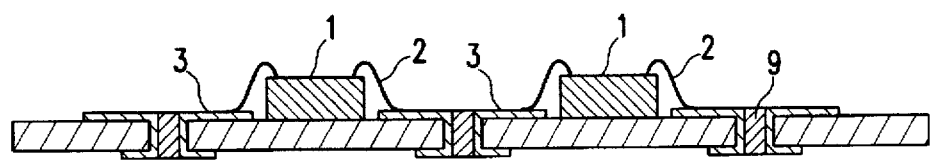
Figure 2C:
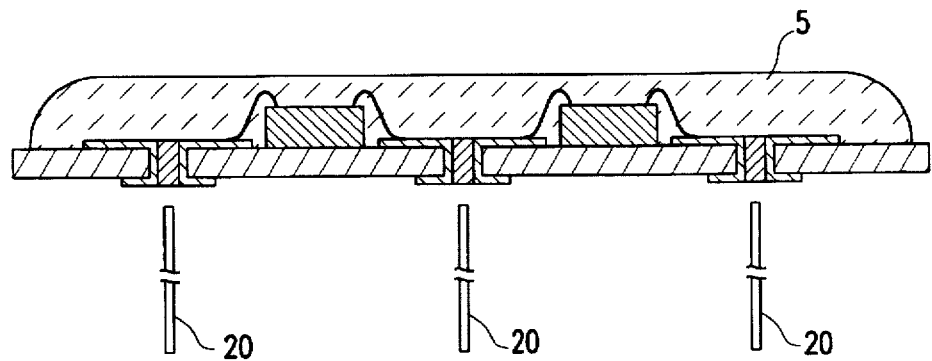

Referring to FIGS. 2A, 2B and 2C, a method of manufacturing the chip-carrier-type electronic part having the structure shown in FIGS. 1A and 1B will now be described. As shown in FIG. 2A, the substrate 6, which has the through holes 7 and associated metallization 3, 8 previously formed at connection portions of the chip carrier, is prepared. Then, stencils 23 having apertures 22 which correspond to through holes 7 are located such that the through holes 7 and the apertures 22 align to one another. Then, with substrate 6 held in a frame (not shown), solder paste 21 is wiped by a squeegee 24 to force solder 21 into each hole 7. At this time, the diameter of each aperture 22 of the stencil 23 is made to be the same as or slightly smaller than the diameter of each through hole 7, and/or the speed at which the squeegee 24 is moved, and the pressure applied by the squeegee 24 are controlled to cause the solder paste 21 to be injected into only the through holes 7. Thus, the solder 9 can be injected into only the through holes 7 even if the solder 9 is melted later. Although the stencil 23 usually has a thickness of 100 µm to 200 µm, the quantity of the solder 9 to be injected is determined in dependence on the volume of the through holes 7, and this requires that the thickness of the stencil 23 and the diameter of the apertures 22 be determined.

The solder 9 may be applied by any known method that has been employed in the surface mounting process. For example, a method using a dispenser may be employed.

After the solder has been introduced into through holes 7, the through holes are heated, for example in a reflow furnace, by hot air, or by infrared rays, to melt the solder paste 21 so that a state in which the through holes 7 are filled with the solder 9 is realized. If necessary, the through holes 7 are cleaned so that flux contained in the solder paste 21 is removed.

A mask having openings corresponding to only the through holes 7 and formed on either or both sides of the substrate 6 by a resist or dry film, followed by printing the solder paste 21 onto the substrate 6 will cause the solder 9 to be place only in the through holes 7 with improved reliability. The resist or dry film or the like is required to be removed after the solder 9 has been enclosed or the solder 9 has been melted. The foregoing method enables use of the stencil 23 to be omitted and to fill only the throughholes 7 with the solder paste 21 by placing the solder paste 21 directly on the substrate 6 and by squeegeeing with the squeegee 24.

Then, die-attachment of the semiconductor device 1 is established, as shown in FIG. 2B, in that the semiconductor device 1 is die-attached and the circuit patterns 3 formed on the substrate 6 are electrically connected to one another by wires 2.

Subsequently, as shown in FIG. 2C, potting (applying) of the molding resin 5 to the substrate 6 is performed. At this time, since the through holes 7 have been filled with the solder 9, undesirable introduction of the molding resin 5 into the through holes 7 can be prevented, and therefore penetration of the molding resin 5 to the reverse side of the substrate 6 can be prevented. As a matter of course, transfer molding using a costly mold which has a structure capable of relieving, or blocking, the through holes 7 is not required, but the foregoing potting molding process using no mold is sufficient to achieve the foregoing object. Even if a transfer mold is used, the structure, in which the through holes 7 are filled with the solder 9, eliminates the necessity of employing a structure capable of relieving from the through holes 7. Furthermore, simultaneous molding can be performed including the through holes 7.

If the potting molding is employed, the periphery of the substrate 6 is required to have a relatively wide area or a dam is required in the periphery of the substrate 6 to eliminate the necessity of using a molding material that exhibits excellent thixotropy. As a result, the molding resin 5 can be satisfactorily introduced into the gaps around the semiconductor device 1, and therefore portions that are not filled with the molding resin 5 are not generated. Thus, the reliability can be improved. If also vacuum defoaming is performed in the process for applying the molding resin 5, generation of the portions that are not filled with the molding resin 5 can be prevented completely. If the surfaces of the substrate 6 and the semiconductor device 1 are activated with oxygen or argon plasma immediately before the process for applying the molding resin 5 is performed, further excellent contact of the molding resin 5 can be established. As a result, the reliability of the electronic part can be improved more satisfactorily.

Then, the molding resin 5 is hardened by a hardening method, such as heating, irradiation with ultraviolet rays or allowing to stand in a humid environment. As a result of the foregoing processes, the material for the electronic part can be manufactured. The material for the electronic part has a structure such that a plurality of the semiconductor devices 1 are provided on the substrate 6, including the through holes 7 and having a large area, and then the molding resin 5 is applied to the upper surfaces of the foregoing elements. That is, electronic part elements sharing the through holes 7 are formed on the substrate 6. Although a small number (one or two) of the electronic part elements may be formed as illustrated, it is preferable that a larger number of electronic part elements be formed in the form of a matrix.

Finally, substrate 6 and mold resin 5 are cut by a dicing blade, or blades, 20 along the through holes 7 which constitute the outline of the chip-carrier type electronic parts, that is, along imaginary lines each of which passes through or near the centers of one or more through holes 7. Thus, independent electronic parts can be obtained. In place of dicing, the final cutting process may be a breaking process in which the substrate 6 is broken. In this case, the substrate 6 is previously provided with V-grooves or perforations along the imaginary lines passing through or near the centers of the through holes 7.

The structure may be constituted such that a plurality of the electronic parts are taken from one substrate 6, as described. In this case, it is preferable that through holes 7 be shared by adjacent electronic parts if the positions of the through holes 7 of the adjacent electronic parts coincide with one another. In a case where through holes 7 are collapsed because the dicing blade 20 has an excess thickness, the substrate 6 is cut at positions slightly displaced from the centers of the through holes 7 to use both sides of the cut substrate 6 (see FIGS. 13A and 13B).

Figure 3A:
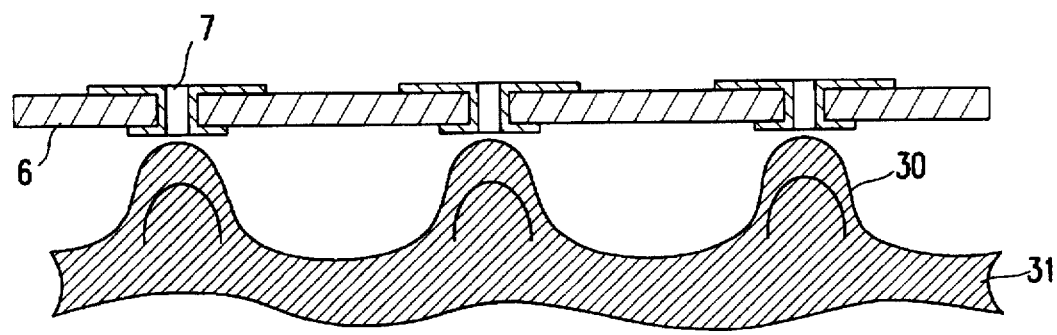
FIGS. 3A, 3B and 3C are side elevational cross-sectional views showing three stages in the performance of another method according to the invention for fabricating the embodiment shown in FIGS. 1A and 1B.
Figure 3B:
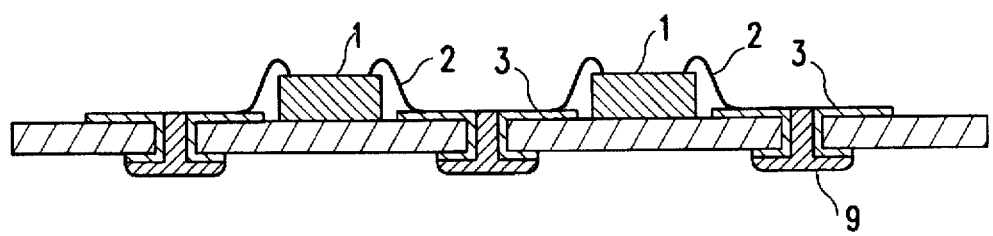
Figure 3C:
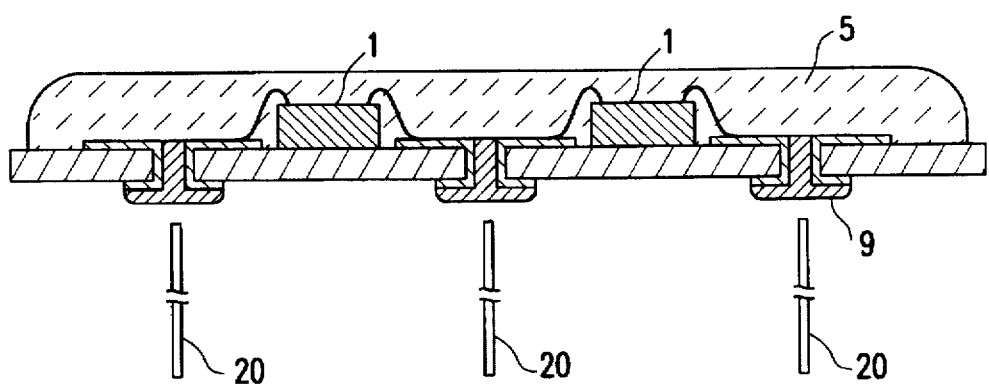

Referring to FIGS. 3A, 3B and 3C, another method of manufacturing a chip-carrier type electronic part having the structure shown in FIGS. 1A and 1B will now be described. As shown in FIG. 3A, a substrate 6 having through holes 7 at the connection portions of the chip carrier is prepared. Then, flux is applied, by a flux applying apparatus (not shown), to only the opening portions of the through holes 7 of the substrate 6. Then, the substrate 6 is placed near and caused to face the surface of a mass of molten solder 31, followed by jetting out a solder stream 30 through nozzles or the like disposed to correspond to the through holes 7 so that the molten solder 31 is brought into contact with the opening portions of the through holes 7. In the foregoing case, if the diameter of each of the through holes 7 is about 0.5 mm or less, the capillary phenomenon causes the solder 9 to be injected into only the through holes 7.

If a mask made of a resist or dry film and having openings corresponding to only the through holes 7 is placed on the surface of the substrate 6 to which the solder stream 30 is jetted or on the two sides of the substrate 6, the solder 9 can be injected accurately into only the through holes 7. After the solder 9 has been injected, the resist or the dry film is removed. As a result of the foregoing manufacturing method, even if the substrate 6 is directly immersed in a soldering chamber, the solder 9 can be injected into only the through holes 7. Use of a solder resist to prevent excess deposition of the solder 9 enables the solder 9 to be accurately injected into only the through holes 7. In the foregoing case, cleaning is performed as the need arises to remove the flux.

The following processes are, as shown in FIGS. 3B and 3C, the same as those described with reference to FIG. 2. Since the connection lands 8 on the bottom of the substrate 6 are not masked with a resist or dry film in the processes shown in FIGS. 3B and 3C, the solder 9 is supplied to the connection lands 8, as well as to the through holes 7. By preliminarily supplying the solder 9 to also the connection lands 8 as described above, soldering can be facilitated when the electronic part obtained by cutting is mounted on the mother board by soldering. As an alternative to this, supply of the solder 9 to the connection lands 8 may be performed simultaneously with printing of the solder paste 21 performed as described with reference to FIG. 2. The supply may be performed simultaneously with performing the process of plating the through holes 7 to be described later.

Note that the through holes 7 may be preliminarily partially plugged with solder or by gold plating, or conductive paste may be used to plug the same, in place of the methods shown in FIGS. 2 and 3. Since the connection with the mother board is usually established by soldering, it is preferable that the metal material to be injected into the through holes 7, which are the connection portions, be a material exhibiting excellent solderability. Specifically, it is preferable to use gold paste as the conductive paste rather than copper paste.

Figure 4A:
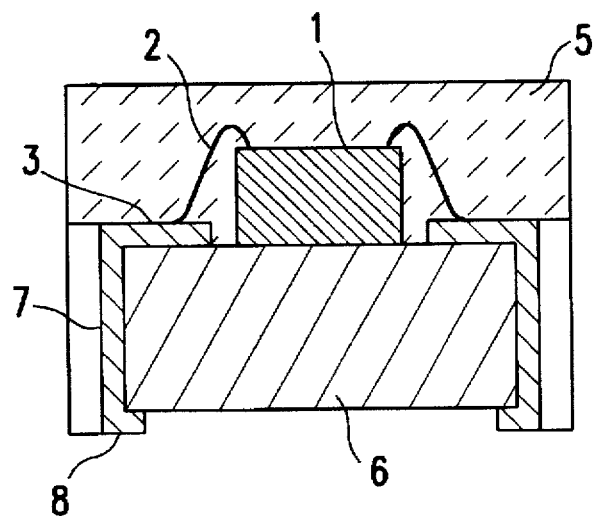
FIGS. 4A and 4B are, respectively, a cross-sectional elevational view and a cross-sectional plan view of an electronic part according to another embodiment of the present invention.
Figure 4B:
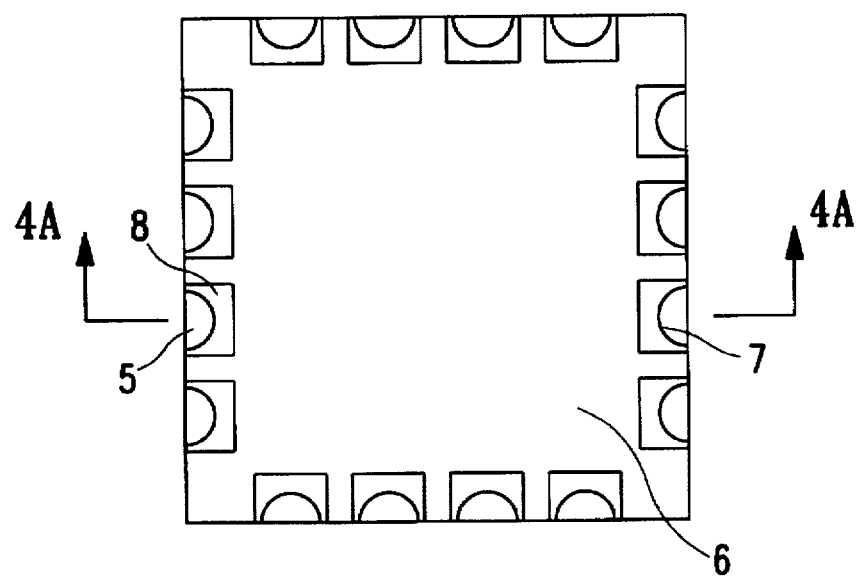

Another embodiment of the present invention will now be described. FIG. 4B is a bottom plan view of a chip-carrier type electronic part. FIG. 4A is a cross sectional view taken along line 4A—4A of FIG. 4B. As shown in FIGS. 4A and 4B, the electronic part according to this embodiment has the same structure as that shown in FIGS. 1A and 1B except that the through holes 7 (the external electrodes) of the electronic part shown in FIGS. 1A and 1B are not filled with solder 9 in FIGS. 4A and 4B. Since solder 9 is not injected into the through holes 7, the structure can be simplified and the cost can be reduced. Since no metal material is injected into the through holes 7, one or more of the through hole 7 can be used as a locating hole or holes for an inspection probe pin for use at the time of performing an electrical inspection of the electronic part, which may be performed as a later process. Thus, the electric performance can assuredly be established.

Figure 5A:
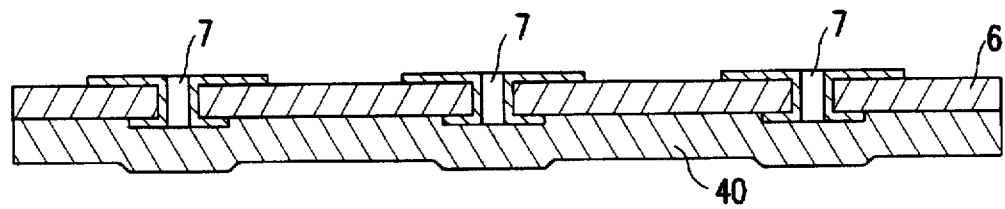
FIGS. 5A, 5B and 5C are side elevational cross-sectional views showing three stages in the performance of a method according to the invention for fabricating the embodiment shown in FIGS. 4A and 4B.
Figure 5B:
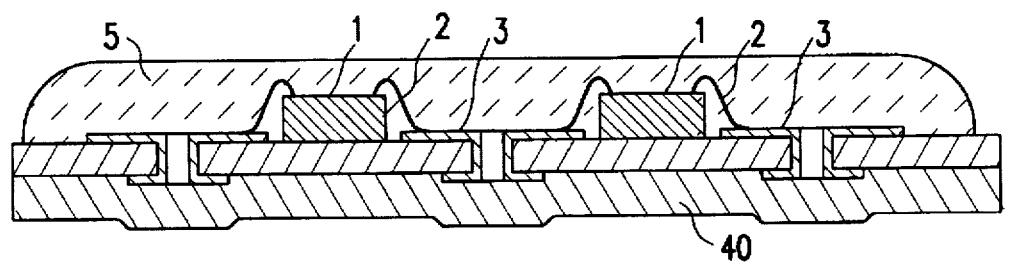
Figure 5C:
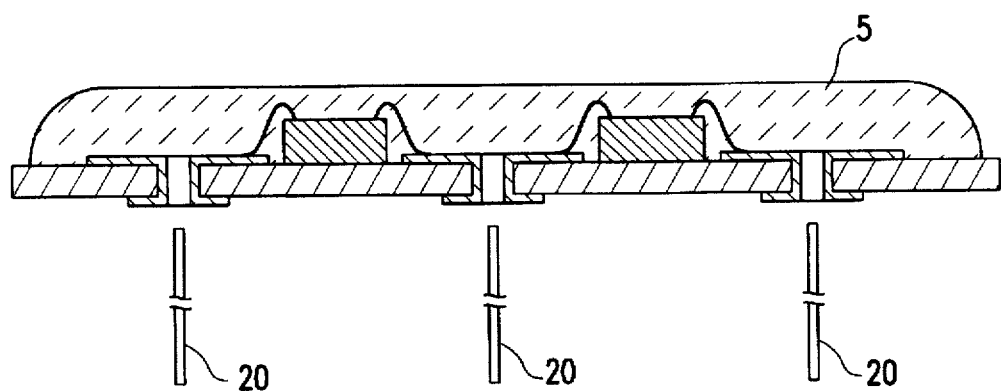

Referring to FIGS. 5A, 5B and 5C, a method of manufacturing the chip-carrier type electronic part shown in FIGS. 4A and 4B will now be described. As shown in FIG. 5A, substrate 6 having through holes 7 formed at the connection portions of the chip carrier is prepared.

Furthermore, an adhesive sheet 40 is applied to the overall bottom surface of the substrate 6. The adhesive sheet 40 may be any adhesive sheet if it does not allow air to pass through. An adhesive sheet of the type presently used in the dicing process for the semiconductor device 1 is preferred because of its reliability, which is a result of the small quantity of impurities contained therein. Although the adhesive sheet 40 may be an adhesive sheet of a type that maintains its adhesiveness, it is preferable that it be a known adhesive sheet having an adhesiveness which deteriorates when subjected to ultraviolet rays or heat because the sheet can then easily be separated in the latter process. In the foregoing state, semiconductor devices 1 are die-attached, as shown in FIG. 5B. Furthermore, each semiconductor device 1 and the circuit patterns 3 formed on the substrate 6 are electrically connected to one another by wires 2.

Then, potting of the molding resin 5 to the substrate 6 is performed in such a manner that the opening portions of the through holes 7 formed on the bottom side of the substrate 6 are covered with the adhesive sheet 40, and the molding resin 5 is applied in the foregoing state. Therefore, air is sealed in the through holes 7 so that undesirable introduction of the molding resin 5, which is an adhesive fluid, into the through holes 7 can be prevented. Therefore, a special cover member is not required in order to prevent undesirable introduction of the molding resin 5 into the through holes 7. In case the molding resin 5 is a usual type molding resin having a viscosity of 20,000 to 50,000 centipoise, attainment of the foregoing effect has been confirmed if each through hole 7 has a diameter of 0.5 mm or less (detailed experimental results omitted). Even if each throughhole 7 has a diameter of 0.5 mm or more, the foregoing effect can be obtained by using a molding resin 5 having high viscosity.

In the foregoing state, the molding resin 5 is hardened, and then the adhesive sheet 40 is separated, leaving the arrangement shown in FIG. 5C. Then, the substrate 6 is cut by a dicing blade or blades 20 along the through holes (the imaginary lines) 7 so that independent electronic parts are obtained. It is preferable that the adhesive sheet 40 be of a type whose adhesive property deteriorates with heat or the like because it can easily be separated, as described above. The molding process may be performed by potting molding that requires no mold, and the molding resin 5 may be a molding resin having usual thixotropy, similarly to the embodiment shown in FIGS. 2A, 2B and 2C. If vacuum defoaming is, in the foregoing state, performed after the molding process has been performed, there is a risk that the molding resin 5 will be undesirably introduced into the through holes 7. Therefore, before the molding process is performed, vacuum defoaming must be limited to only the molding resin 5 to remove bubbles in the molding resin 5.

By employing the foregoing manufacturing method, the gold-plated through holes (the external electrodes) 7 appear on the side surfaces of the electronic parts taken by cutting. Thus, solder fillets can easily be formed in the through holes 7 when the connection with the mother board is established, causing the electronic part to be more easily soldered. If a ceramic substrate is used, a similar effect to that obtainable from the foregoing printed board can be obtained if the through holes 7 have the hollow structure. If a conductive paste is injected, the same structure described with reference to FIGS. 1A and 1B is produced.

Figure 6A:
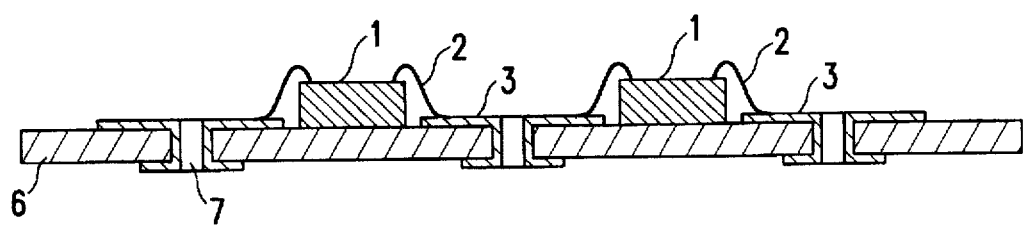
FIGS. 6A, 6B and 6C are side elevational cross-sectional views showing three stages in the performance of a second method according to the invention for fabricating the embodiment shown in FIGS. 4A and 4B.
Figure 6B:
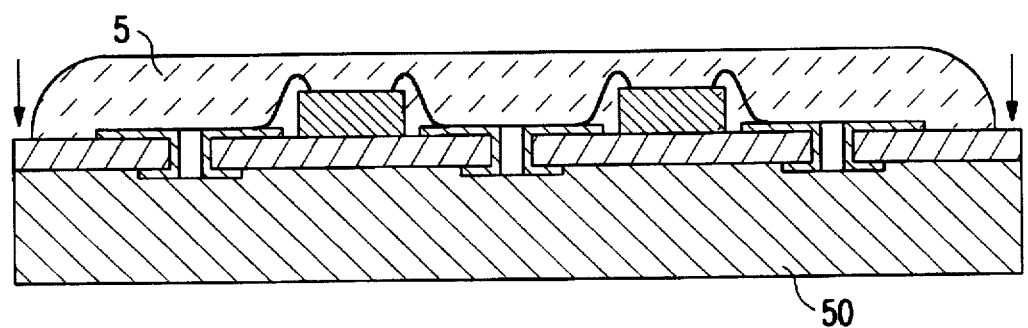
Figure 6C:
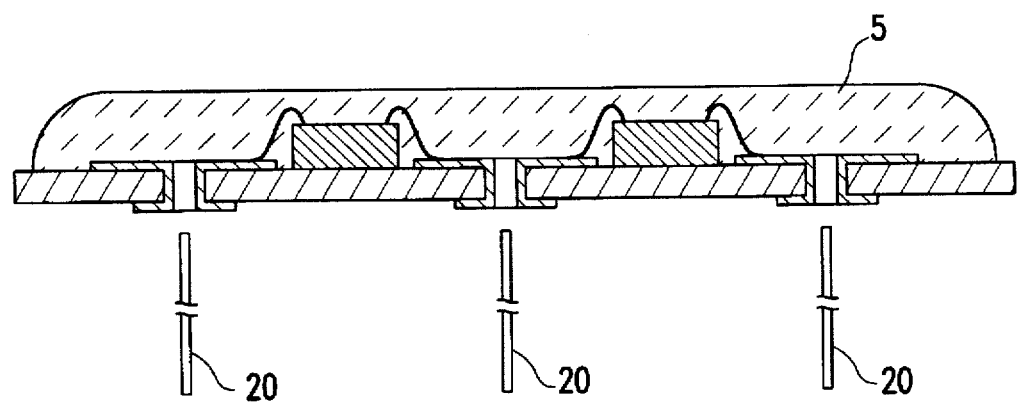

Another method of manufacturing the chip-carrier-type electronic part having the structure as shown in FIGS. 4A and 4B will now be described with reference to FIGS. 6A, 6B and 6C. As shown in FIG. 6A, a substrate 6 having through holes 7 previously formed in the connection portions of the chip carrier is prepared, followed by causing the semiconductor device 1 to die-attach to the upper surface of the substrate 6. Furthermore, the semiconductor device 1 and the circuit patterns 3 formed on the substrate 6 are electrically connected to one another by wires 2. Then, as shown in FIG. 6B, silicone rubber 50 is pressed against the bottom of the substrate 6 to cover the through holes 7, followed by potting the molding resin 5, which is then hardened in place. The reason why the molding resin 5 is not introduced into the through holes 7 is due to the same principle as that in the foregoing case where the adhesive sheet 40 is used. As shown in FIG. 6C, the subsequent steps are the same as described with reference to FIGS. 5A, 5B and 5C.

In order to improve the contact between the through holes 7 and the silicone rubber 50 to reliably maintain air in the through holes 7, each of the portions of the silicone rubber 50 which is in contact with a through hole 7 and with its associated connection land 8 may be previously formed into concave shape to receive the convex shape of the land. As an alternative to this, pin-like projections may be formed on the surface of the silicone rubber 50 to plug the inside portions of the through holes 7.

To prevent introduction of the molding resin 5 into the through holes 7, the through holes 7 may be plugged by a known method of plugging a hole with resin that is employed in a known method of manufacturing a substrate 6, followed by removing the plugging resin after the dicing process has been completed. In the foregoing case, resin of a type that is dissolved in an alkali water solution is usually used to remove the resin after the dicing process has been completed, the removal being performed such that the resin is washed off.

Figure 7A:
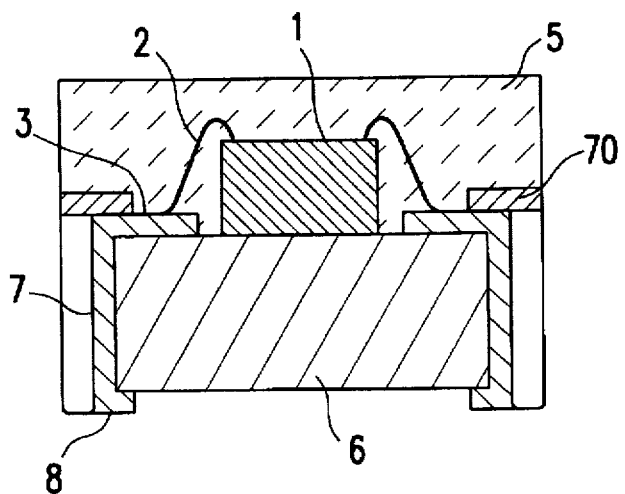
FIGS. 7A and 7B are, respectively, a cross-sectional elevational view and a cross-sectional plan view of an electronic part according to another embodiment of the present invention.
Figure 7B:
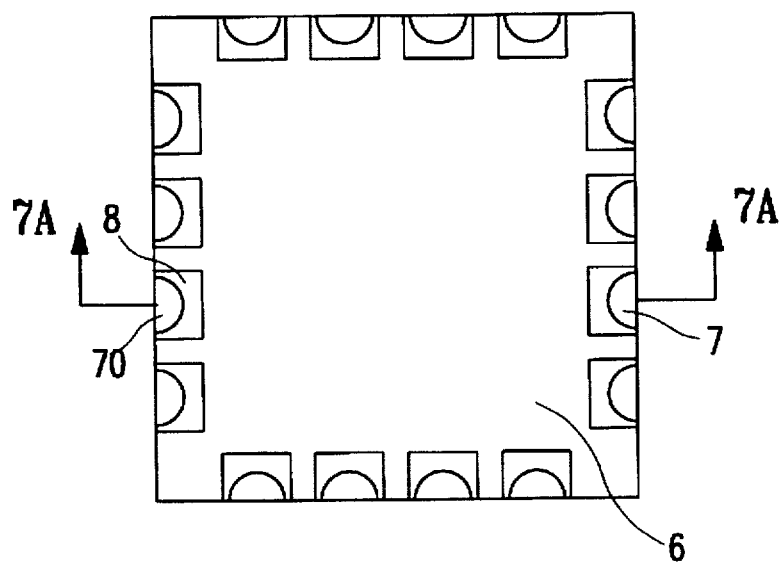

Another embodiment of the present invention will now be described. FIGS. 7A and 7B show a chip-carrier type electronic part according to this embodiment of the present invention. FIG. 7B is a bottom plan of the chip-carrier type electronic part. FIG. 7A is a cross sectional view taken along line 7A—7A of FIG. 7B. As shown in FIGS. 7A and 7B, the electronic part according to this embodiment has through-hole covering members 70 previously placed on the through holes (the external electrodes) 7. The semiconductor device 1 is caused to die-attach to the upper surface of the substrate 6 cut to have an outer shape passing through or near the centers of the through holes 7. Furthermore, the semiconductor device 1 and the circuit patterns 3 formed on the substrate 6 are electrically connected to one another by wires 2.

The through-hole covering members 70 are disposed on only the through holes 7 and comprise, for example, dry films, glass epoxy plates or ceramic plates each of which has adhesiveness and is used in the process for manufacturing a substrate. In this case, the through-hole covering members 70 are manufactured by punching with a pattern to have shapes that can be placed on the through holes 7, followed by being applied to the substrate 6. As a matter of course, if a dry film is used, it is applied to the entire surface of the substrate 6, followed by leaving the required portions corresponding to the through holes 7 in a photoprocess similar to that employed in the conventional technology of manufacturing a substrate.

The glass epoxy plate, previously formed, may be applied to the substrate 6 by an adhesive agent, or a prepreg of an unformed glass epoxy plate may be previously formed by pattern drawing or the like, followed by being located, and then it is heated and forcibly applied to the surface. If the substrate 6 is made of ceramics, a non-sintered green sheet may be preliminarily formed by pattern drawing or the like, followed by being located, and then the green sheet is, together with the substrate 6, heated and pressurized so that the green sheet is sintered to the substrate 6. Note that the basic structure except the through-hole covering members 70 is the same as that of the electronic parts shown in FIGS. 1 and 4.

Figure 8A:
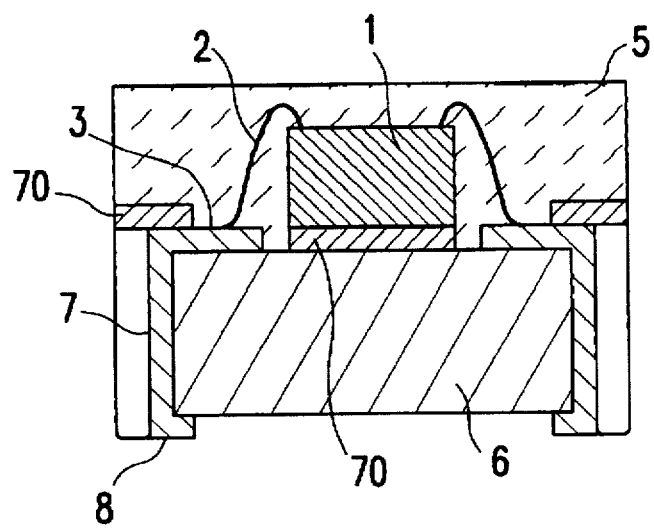
FIGS. 8A and 8B are, respectively, a cross-sectional elevational view and a cross-sectional plan view of an electronic part according to another embodiment of the present invention.
Figure 8B:
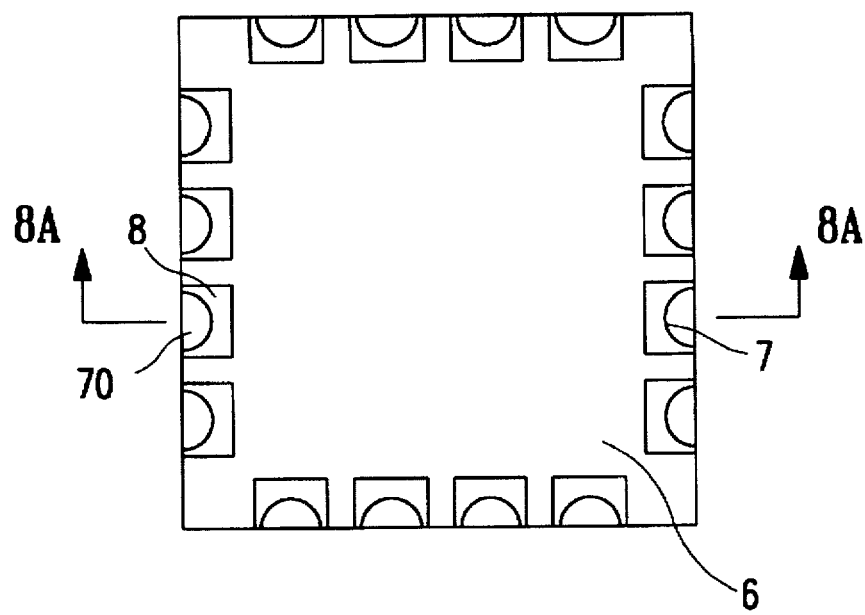

Another embodiment of the present invention will now be described. FIGS. 8A and 8B show a chip-carrier type electronic part according to another embodiment of the present invention. FIG. 8B is a bottom plan view of the chip-carrier type electronic part. FIG. 8A is a cross sectional view taken along line 8A—8A of FIG. 8B. As shown in FIGS. 8A and 8B, the electronic part according to this embodiment has a structure such that through-hole covering members 70 are disposed between the semiconductor device 1 and the substrate 6, as well as over the through holes (the external electrodes) 7. That is, the semiconductor device 1 is not caused to directly die-attach to the substrate 6, but is caused to die-attach to the upper surface of the through-hole covering members (pads) 70. The remaining structural features are the same as those shown in FIGS. 7A and 7B.

The through-hole covering members 70 are required to be opened, or removed, at locations where the wires 2 are connected to the circuit patterns 3. In the case where the through-hole covering members 70 comprise sheets having adhesiveness, glass epoxy plates or ceramic plates, the necessity of forming the punched openings by using a costly pattern, as is required in the case shown in FIGS. 7, can be eliminated. The punched openings may be formed by a drill bit. Furthermore, the semiconductor device 1 can easily be located. If the structure shown in FIGS. 8A and 8B is employed, the through-hole covering members 70 can easily be manufactured and the semiconductor device 1 can easily be mounted as compared with the structure shown in FIGS. 7A and 7B. Thus, the cost of the electronic part can be lowered.

Figure 9A:
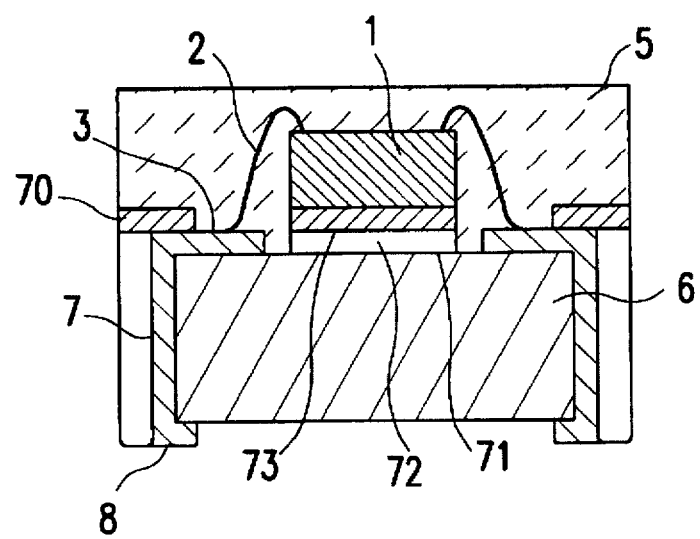
FIGS. 9A and 9B are, respectively, a cross-sectional elevational view and a cross-sectional plan view of an electronic part according to another embodiment of the present invention.
Figure 9B:
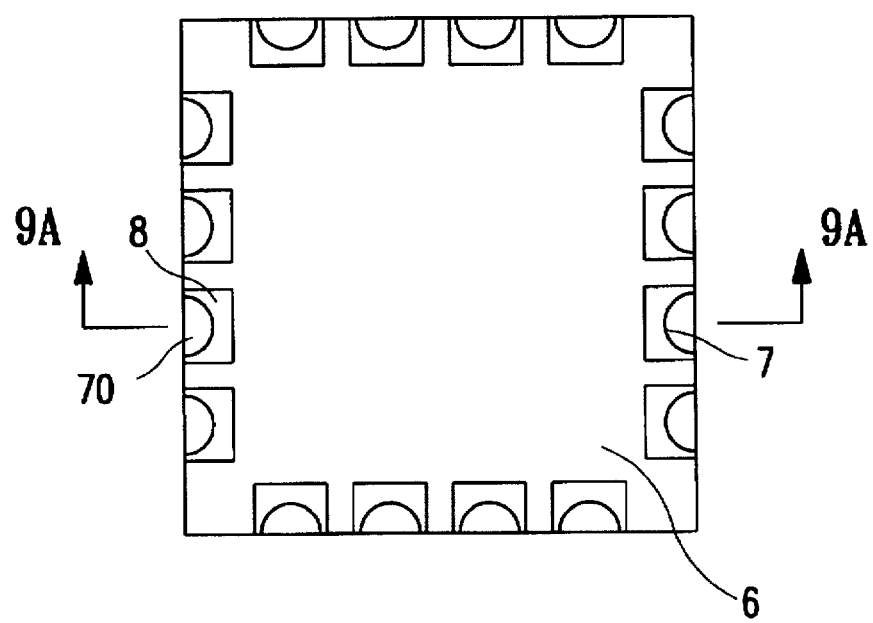

Another embodiment of the present invention will now be described. FIGS. 9A and 9B show a chip-carrier type electronic part according to this embodiment of the present invention. FIG. 9B is a bottom plan view of the chip-carrier type electronic part. FIG. 9A is a cross sectional view of the chip-carrier-type electronic part taken along line 9A—9A of FIG. 9B. As shown in FIGS. 9A and 9B, the electronic part according to this embodiment has a structure such that the through-hole covering member (pad) 70 disposed between a semiconductor device 1 and the substrate 6, as shown in FIG. 8A, has a penetrating hole 73 of any desired size. The penetrating hole 73 is filled with silver paste 72. The silver paste 72 establishes an electrical connection between a die pad 71 formed on the substrate 6 and the bottom of the semiconductor device 1.

In general, the die pad 71 is usually connected to a certain fixed potential. Therefore, the structure shown in FIGS. 9 is effective in a case where the potential of the die of the semiconductor device 1 must be fixed. Also in this case, the through-hole covering members 70 are required to have openings at locations where the wires 2 are connected to the circuit patterns 3, and at the locations of the foregoing penetrating holes 73. Therefore, if a sheet having adhesiveness, a glass epoxy plate or a ceramic plate is used as the through-hole covering members 70, the through-hole covering members 70, which have been machined by a drill bit and the cost of which can therefore be reduced, may be applied similarly to the structure shown in FIGS. 8.

Figure 10A:
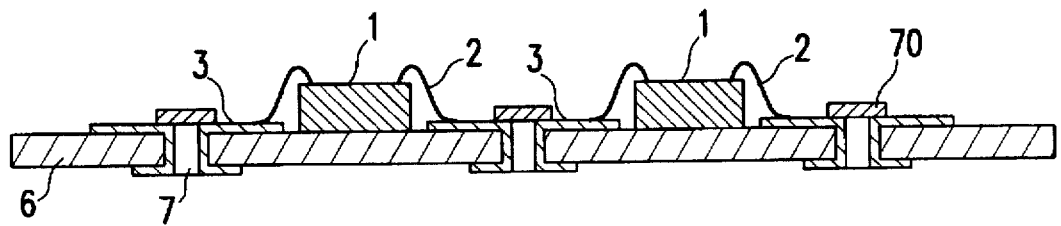
FIGS. 10A and 10B are side elevational cross-sectional views showing two stages in the performance of a method according to the invention for fabricating the embodiments shown in FIGS. 7A to 9B.
Figure 10B:
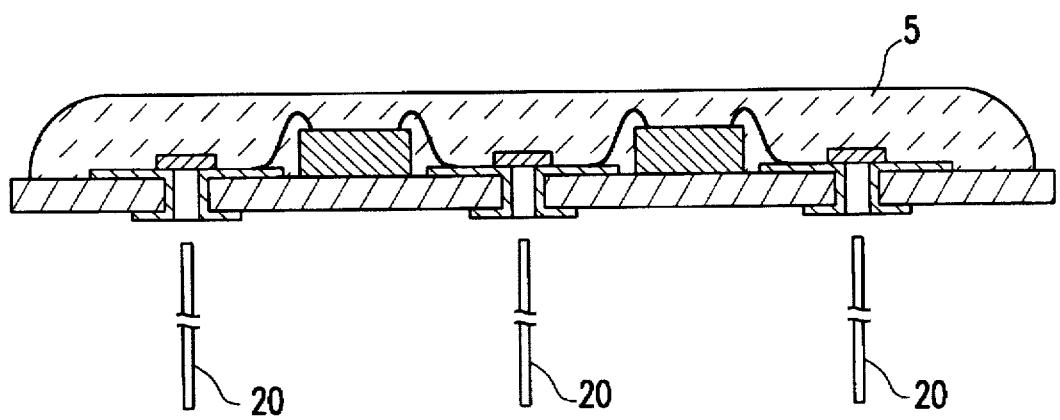

A method of manufacturing the chip-carrier type electronic part having the structure shown in FIGS. 7 to 9 will now be described with reference to FIGS. 10A and 10B. As shown in FIG. 10A, the substrate (the substrate material) 6 having the through holes 7 formed at the connection portions of the chip carrier is prepared. Then, the through-hole covering members 70 are attached onto the through holes 7. The through-hole covering members 70 are required to be formed by punching with a pattern or the like to locate the dry film, the glass epoxy plate or the ceramic plate, each of which can be used, in the technique for manufacturing substrates, on only the through holes 7, followed by being applied to the substrate 6. In the case where a dry film is used, it is applied to the entire surface of the substrate 6, followed by leaving only the portions corresponding to the through holes 7 in a process similar to that employed in the conventional technique for manufacturing a substrate.

As shown in FIG. 10A, the through-hole covering members 70 may be disposed to correspond to only the through holes 7, or may be further disposed between the semiconductor devices 1 and the substrate 6 to serve as pads for the semiconductor devices 1, as described with reference to FIGS. 8 and 9. Then, the semiconductor device 1 is caused to die-attach. The semiconductor device 1, which has been die-attached, and the circuit patterns 3 formed on the substrate 6 are electrically connected to one another by the wires 2. Furthermore, potting (applying) of the molding resin 5 onto the substrate 6 is performed, as shown in FIG. 10B. Since the through holes 7 are covered with the through-hole covering members 70 at this time, undesirable introduction of the molding resin 5 into the through holes 7 can be prevented. Thus, undesirable penetration of the molding resin 5 to appear on the bottom of the substrate 6 can be prevented. Finally, similarly to FIG. 2C, the electronic part material is cut by a dicing blade or blades 20 along the portion of the through holes 7, which is the outline of the chip-carrier-type electronic part, that is along imaginary lines passing through or near the centers of the through holes 7. Thus, independent electronic parts can be obtained.

Figure 11:
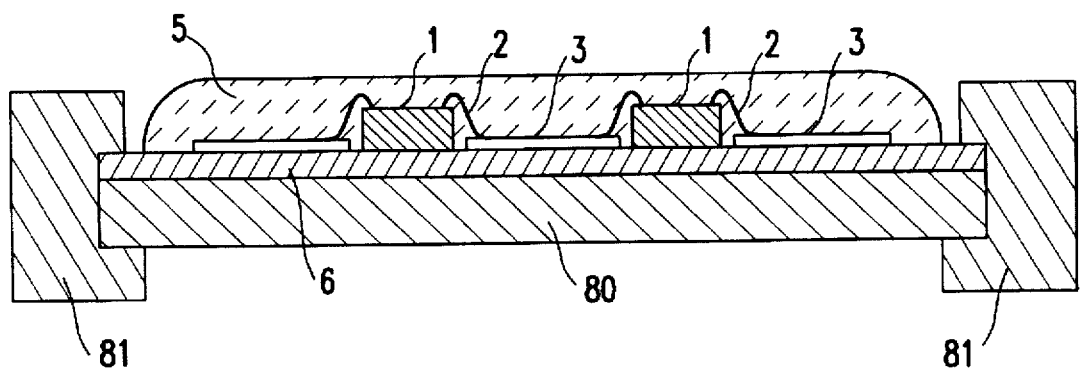
FIG. 11 is a side elevational cross-sectional view showing a step in a method of manufacturing an electronic part according to an embodiment of the present invention.

Referring to FIG. 11, a method of manufacturing another electronic part will now be described. Similarly to the plurality of the embodiments above, semiconductor device 1 are caused to die-attach and are wire bonded. Then, potting (applying) of molding resin 5 onto the substrate 6 is performed. In this embodiment, a flatness-maintaining means for maintaining the flatness of the substrate 6 when the molding resin 5 is hardened is attached to the substrate 6. The flatness-maintaining means comprises a flatness-maintaining plate 80, which is placed against the bottom of the substrate 6, and holding members 81 for holding both the flatness-maintaining plate 80 and the substrate 6 therebetween, the holding members 81 each having a U-shape cross sectional shape facing side. The holding members 81 are detachably attached to the substrate 6. In that state, the molding resin 5 is hardened by a method adaptable to the employed material for the molding resin 5. Since the molding resin 5 is composed of thermosetting-type epoxy resin in general, the molding resin 5 is hardened while being injected into a thermostatic chamber.

The coefficient of thermal expansion (which is 2 to $3\times10^{-5}/°$ C. for a usual resin) of the molding resin 5 is larger than the coefficient of thermal expansion (which is about $1.5\times10^{-5}/°$ C. for FR-4, which is a typical example) of the substrate 6. Furthermore, the molding resin 5 is contracted by several to tens of % when hardened. Therefore, if the substrate 6, to which the molding resin 5 has been applied, is unrestrained, the substrate 6 will be warped into a concave shape relative to the molding resin 5. However, if the molding resin 5 is hardened in a state where the flatness-maintaining means is attached to the substrate 6, the relaxation phenomenon (the creep phenomenon) of the viscous component of the molding resin 5 relaxes the degree of the warp of the substrate 6. Consequently, warping of the substrate 6, from which the flatness-maintaining means can then be removed, can be prevented satisfactorily. Therefore, an advantage can be attained in later processes, such as the dicing process, the process of probing electrical characteristic inspection and the like, which require the flatness of the substrate 6. Note also that warping of the electronic parts, which are the products, can, of course, be prevented satisfactorily.

If the flatness-maintaining means is attached to the substrate 6 as shown in FIG. 11 after the molding resin 5 has been hardened and substrate 6 has warped, and as well the substrate (the electronic part material) 6 is again heated followed by being cooled gradually, the warping of the substrate 6 can be relaxed, or reversed. The foregoing process is a process generally called "annealing", which is also due to the relaxing phenomenon (the creep phenomenon) of the viscous component of the molding resin 5. As a matter of course, a combination of the process for hardening the molding resin 5, in a state where the flatness-maintaining means is attached to the substrate 6, and a process for annealing the substrate 6, in a state where the flatness-maintaining means is attached to the substrate 6, will further prevent warping of the substrate 6.

An effective method of applying the molding resin in the method of manufacturing the electronic parts according to this embodiment will now be described. Although illustration is omitted here, the method of applying the molding resin has an arrangement that the quantity of the molding resin to be introduced (applied) into the substrate is controlled by weight. Namely, the area to which the molding resin is applied is determined by the subject substrate. The specific gravity of the molding resin (the thermosetting epoxy resin) is about 1.8. Therefore, control of the molding resin to be applied by weight will enable the thickness of the applied molding resin to be controlled. By considering the volume of the part elements to be molded, such as the semiconductor device, the thickness of the applied molding resin can be controlled accurately. Thus, the molding resin can be applied with a thickness accuracy of 0.8 mm to 0.9 mm on a substrate having a thickness of 0.4 mm. As a result, generation of cracks during the molding process can be prevented, and the thickness of the electronic part can be minimized.

Furthermore, in the method of applying the molding resin according to this embodiment, the substrate, to which the molding resin has been applied, is held horizontally during the process for hardening the molding resin. That is, jigs for horizontally holding the substrate are used such that the molding resin is hardened in a state where the substrate is held horizontally in a thermostable chamber. As a result, the thickness of the applied molding resin for the electronic part material can be made uniform, or constant across the substrate surface. Thus, the thickness of the molding resin applied to the electronic parts obtained by cutting can be made constant, causing the thicknesses of the electronic parts to be made constant. As a means for weighing the foregoing molding resin, any adequate balance, exemplified by an electronic balance, may be employed. As the foregoing jigs, it might be considered feasible to employ a three-point-suspension (three legs, the height of each of which can be adjusted) frame having a level.

Figure 12:
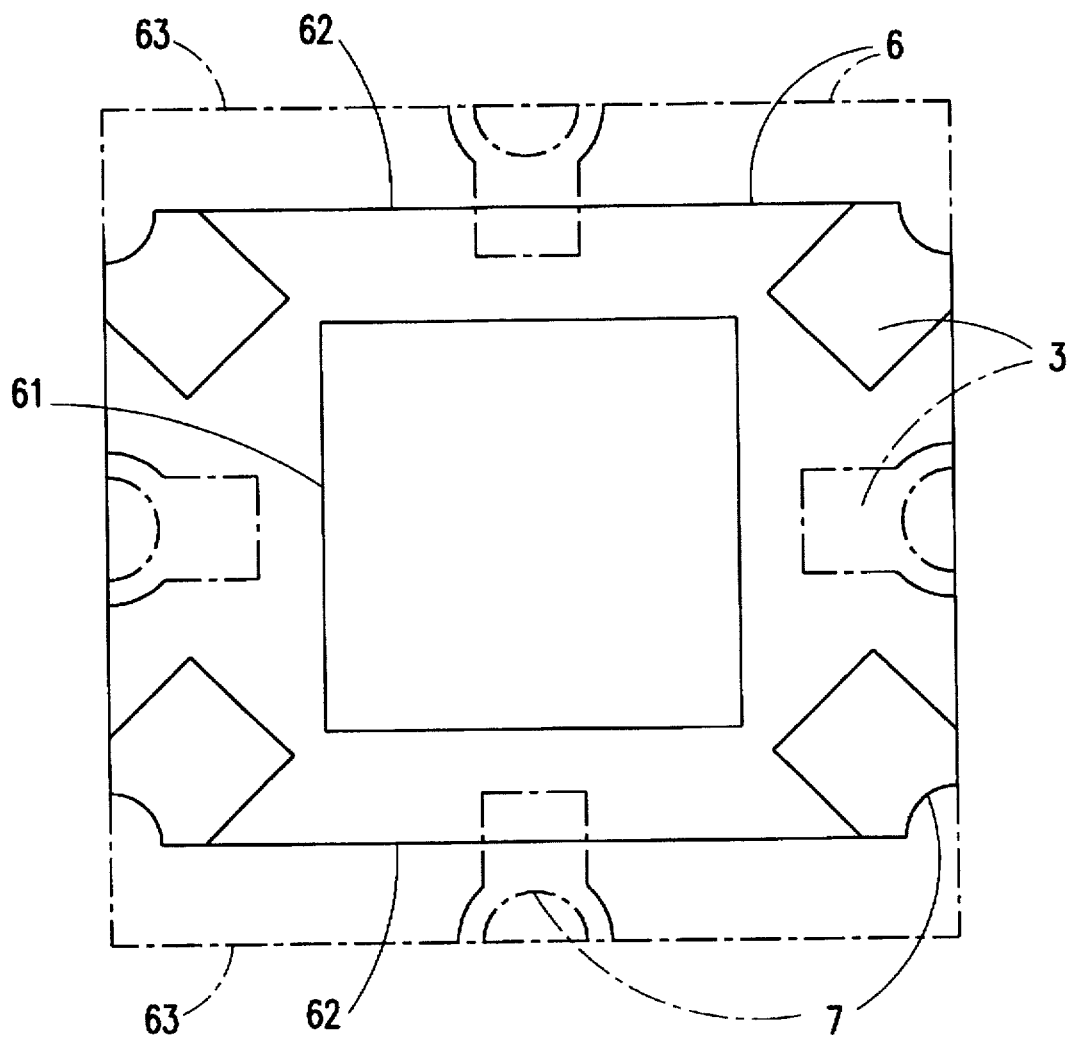
FIG. 12 is a plan view of a substrate of an electronic part according to an embodiment of the present invention.

Another embodiment of the present invention that can be applied to any of the foregoing structures of the electronic parts will now be described. FIG. 12 is a plan view of the substrate of a chip-carrier-type electronic part according to this embodiment of the present invention. In FIG. 12, two types of substrate structures are superimposed for purposes of comparison. Referring to FIG. 12, reference numeral 61 represents a die-attached portion of the semiconductor device common to the two types of the substrate structure. Then, the substrate 6, the circuit patterns 3 and the through holes 7 are designated by solid lines for a first substrate structure bounded by upper and lower lines 62, while the same are designated by dot-dash lines for a second substrate structure bounded by upper and lower lines 63. The solid lines designate the substrate structure bounded by lines 62 according to this embodiment in which the four corners of the substrate 6 have through holes 7 and circuit patterns 3 that also serve as bonding pads for use in the wire bonding process. The alternate dot-dash lines designate a conventional substrate structure bounded by lines 63 in which the four sides of the substrate 6 have the through holes 7 and the circuit patterns 3.

In a particular case where the semiconductor device 1 and the circuit patterns 3 are connected at four or fewer connection points, the size of the electronic part is minimized and the electronic part has a regular size, it is, as can be understood from FIG. 12, advantageous to reduce the size of the substrate and to form the through holes 7 at the four corners of the substrate 6 in place of forming the same on the sides of the substrate 6 to productively use the four corners of the substrate 6, which otherwise become dead spaces. If the semiconductor device 1 and the circuit patterns 3 are connected by three lines or fewer, use of all four corners of the substrate 6 is not required. When the electronic part having the substrate structure bounded by lines 62 is manufactured, a substrate (substrate material) 6 having through holes 7 formed at intersections of imaginary lines, which become cut lines later, is prepared so that electronic part material is manufactured, followed by being cut along the imaginary lines.

Figure 13A:
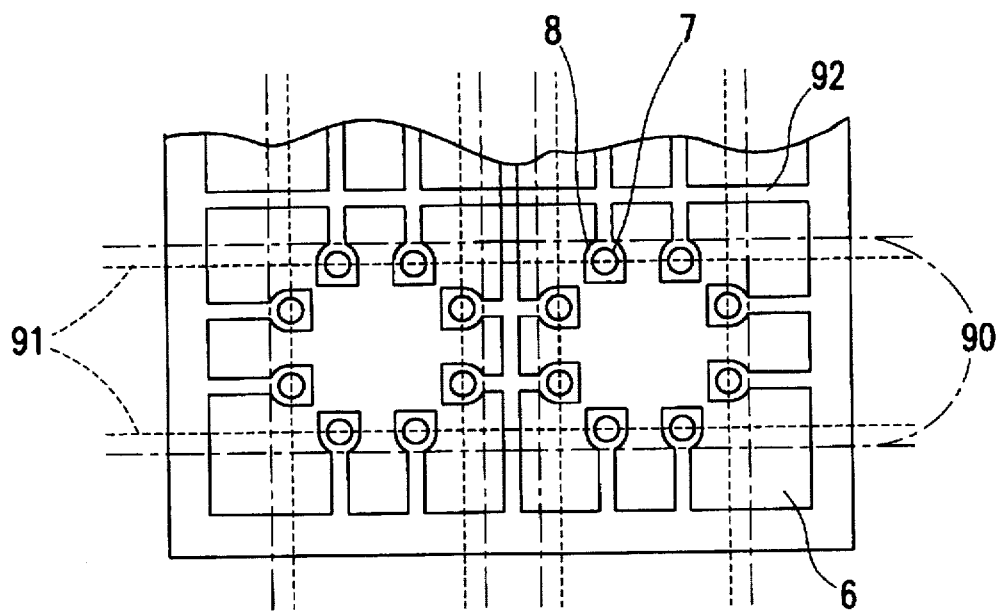
FIGS. 13A and 13B are plan views showing a step in a method of manufacturing an electronic part according to an embodiment of the present invention.
Figure 13B:
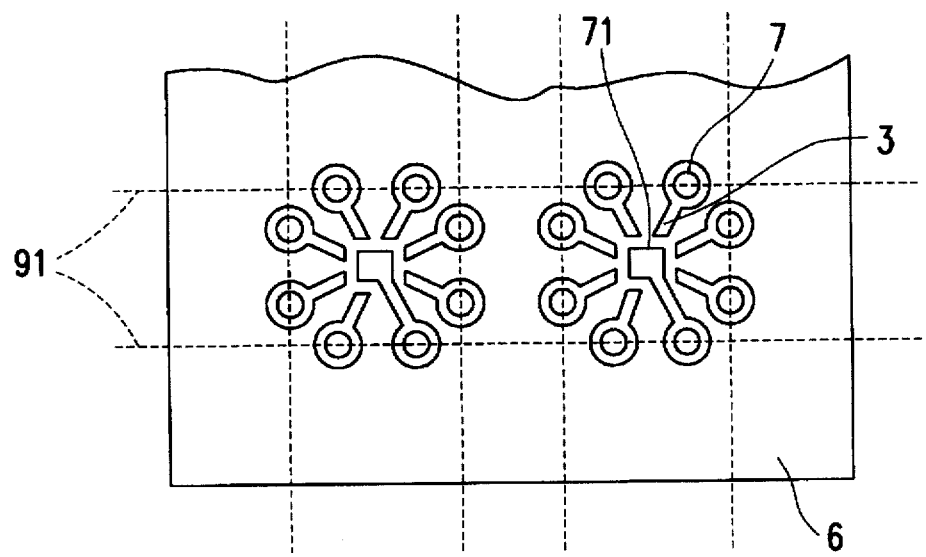
Figure 14A:
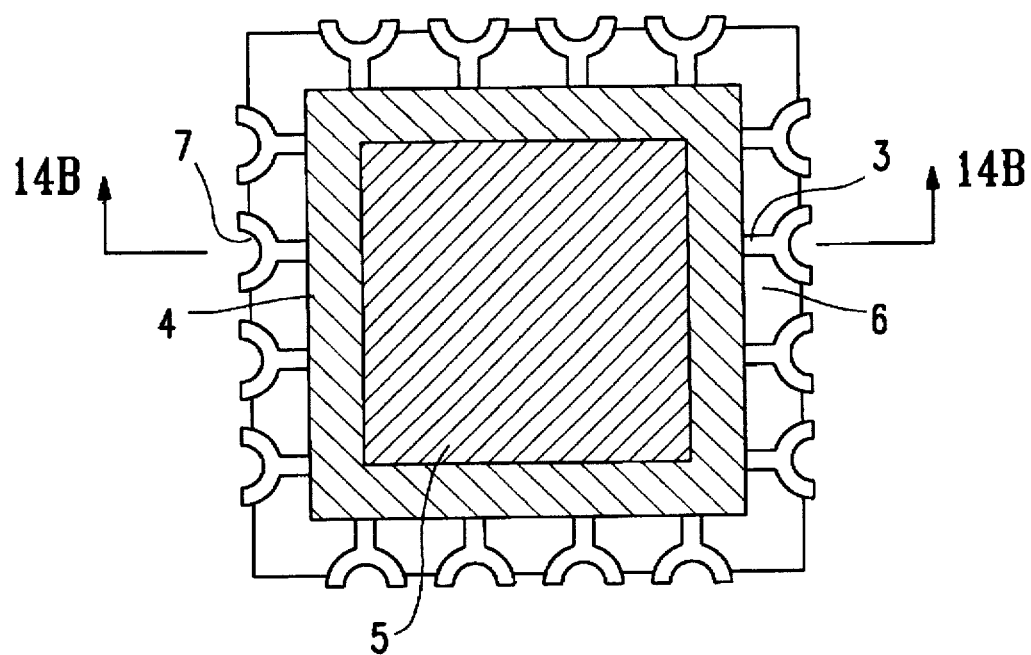
FIGS. 14A and 14B are, respectively, a cross-sectional plan view and a cross-sectional elevational view of an electronic part according to the prior art.
Figure 14B:
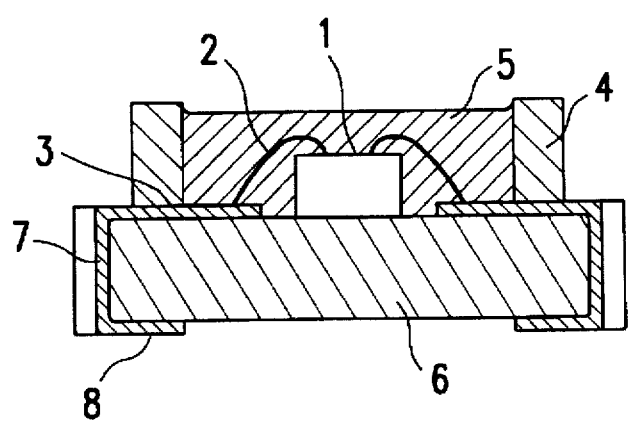

Referring to FIGS. 13A and 13B, another manufacturing method that can be applied to any chip-carrier type electronic part will now be described. The process for cutting the substrate 6 to be described below is performed after the semiconductor device 1 is mounted and the molding resin 5 has been applied, as described above. To simplify the description, the semiconductor device 1 and the wires 2 are omitted from illustration. FIG. 13A is a bottom plan view of the substrate (the substrate material) 6 for use in a chip-carrier type electronic part according to the present invention. FIG. 13B is a top plan view of a portion of the substrate 6.

Referring to FIG. 13B, reference numeral 71 represents a die pad to which the semiconductor device 1 die-attaches. The semiconductor device 1 and the circuit patterns 3 are connected to one another by wire bonding, followed by being connected to the bottom of the substrate 6 by way of metallization and possibly also solder in the through holes 7. Dashed lines in FIG. 13B represent full dicing lines (imaginary line) 91. The boundary lines outside of the region enclosed by lines 91 represent the outline of the chip-carrier type electronic part. As a matter of course, the molding resin 5 is, in the actual process, applied to the entire top surface of the substrate 6, and therefore the circuit patterns 3, the through holes 7 and the like shown in FIG. 13B would be hidden by the resin. The appearance of the bottom of the substrate 6 shown in FIG. 13A is, before the dicing process, not changed before and after the mounting process.

As shown in FIG. 13A, the periphery of the bottom of the substrate 6 has plating leads 92 that are connected to through holes 7. The plating leads 92 cause the circuit patterns 3 on the surface of the substrate 6, the through holes 7 and the connection lands 8 on the bottom of the substrate 6 to be subjected to electric plating. Therefore, the plating leads 92 electrically short-circuit all of the through holes 7, the circuit patterns 3 connected to the through holes 7, and the outer wiring portions of the semiconductor device 1 during plating.

After plating has been applied, the short-circuit state is eliminated by cutting the plating leads 92 by half dicing lines 90 in this embodiment. Half dicing is, in this embodiment, performed by cutting the bottom surface of substrate 6 to a depth at least exceeding the thickness of the plating leads 92 and less than the total thickness of the electronic part including the molding resin. In the foregoing case, it is preferable that scattering of the chip-carrier type electronic parts occurring as a result of the later full dicing process be prevented by applying a sheet having adhesiveness to the top surface of the molded substrate 6. Since the plating leads 92 are cut by the half dicing process, the electrical short circuit of all of the through holes 7, the circuit patterns 3 connected to the through holes 7, and the outer wiring portions of the semiconductor device 1 is eliminated. Thus, the portion from the through holes 7 to the semiconductor device 1 is, similar to the final state of the chip-carrier type electronic part, an electronic part element that is electrically independent of adjacent part elements. As a result, introducing a pin probe into a through hole 7, the portion from the bottom of the substrate 6 to the semiconductor device 1 can be electrically inspected. After the inspection has been completed, cutting along the full dicing lines 91 is performed to produce the final shape of the chip-carrier type electronic part.

As a result, the chip-carrier type electronic part can be inspected in the state of the outline of the substrate. Therefore, the inspection and locating can easily be performed as compared with the case where an independent electronic part is inspected. The half dicing lines 90 and the full dicing lines 91 may be superimposed on one another. That is, a similar effect can be obtained if half dicing is performed at the outline position of the final chip-carrier type electronic parts and full dicing is performed at the same position after the parts have been inspected, followed by being manufactured to the final chip-carrier type electronic parts.

Half dicing may be omitted and full dicing may be performed along the foregoing full dicing lines 91, followed by being manufactured to the final chip-carrier type electronic parts. Also in this case, a sheet having adhesiveness is applied to the top surface of the substrate 6. As a result, scattering of the electronic parts which have been fully diced can be prevented, and the plating leads 92 can be cut. Therefore, the chip-carrier type electronic parts can be inspected in a state of the outline state of the substrate.

Although omitted from illustration, the plating leads 92 may be formed on both sides of the substrate 6. In the foregoing case, local passage of the plating electric current can be restricted. Thus, the thickness of plating can be made uniform. In the foregoing case, it is preferable that half dicing be omitted and full dicing be directly performed.

Although the foregoing embodiments have been described in which the semiconductor device is mounted on the substrate by a so-called wire bonding method, it may, of course, be mounted by another known method, such as a TAB method, a flip chip method or the like. If the semiconductor device is mounted by the flip chip method using the face-down method, the area required to arrange the wires can be reduced. Therefore, the size of the electronic part can, of course, be reduced. Furthermore, although the foregoing embodiments have been described with reference to structure in which the semiconductor device is mounted on the chip-carrier type electronic part, the part to be mounted is not limited to a semiconductor device. Any element part, such as a capacitor, an inductor or the like, may be mounted. Furthermore, a plurality of elements, as well as a single element, may be mounted on a substrate according to each embodiment. As a matter of course, the substrate may be used as a package on which a so-called an MCM (Multi-Chip Module) is mounted.

Since the present invention is structured as described above, the following effects can be obtained.

Since an electronic part according to the invention has a structure such that the surface of the molding resin is formed to be flat, the total thickness can be made uniform and less than that required in the prior art. Furthermore, since no dam is provided, the structure can be simplified and the area of the plane shape can be reduced. In addition, the through holes are used to facilitate the electrical inspection. As a result, the electronic part can be manufactured at low cost while reducing its size. By injecting metal material having solderability into the through holes, a dam can be omitted from the structure and soldering facility can be improved. Thus, the size of the electronic part can be reduced, and the reliability can be improved. Similarly, the size can be reduced by providing the covering members for covering the opening portions of the through holes. In addition, the through holes can be formed at the corners of the substrate so that the size of the electronic part can be reduced.

Electronic part materials according to the present invention enable a multiplicity of electronic part elements, to be formed into independent electronic parts, to be manufactured simultaneously. Furthermore, the electronic parts can be manufactured (obtained by cutting) efficiently. By providing dams for the substrate material, the molding resin can be equally and satisfactorily applied to each electronic part element. Furthermore, the provided plating leads enable each electronic part element to be simultaneously subjected to plating.

According to the methods of manufacturing electronic parts according to the invention, a multiplicity of the electronic parts according to the invention can be manufactured simultaneously. That is, electronic parts can be efficiently manufactured with a reduced cost while reducing the size thereof. By controlling the molding resin by weight and by hardening the same while it rests on a horizontal surface, the electronic parts can be formed to have the minimum thickness while maintaining the molding reliability. When the molding resin is hardened, flatness-maintaining means is used so that the flatness of the substrate can be maintained accurately with a simple method. Thus, the reliability of the electronic part can be improved. Furthermore, electrical inspection can be performed in a state before cutting the substrate from which individual electronic parts are to be obtained. Therefore, the inspection process can be simplified.

Although the invention has been described in its preferred form with a certain degree of particularity, it is understood that the present disclosure of the preferred form can be changed in the details of construction and the combination and arrangement of parts may be resorted to without departing from the spirit and the scope of the invention as hereinafter claimed.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An electronic part of a leadless package type comprising:
   a rectangular substrate having a top surface and a periphery and provided along the periphery with a plurality of through holes that extend to the top surface and with a plurality of external electrodes which extend along said through holes;
   an element part placed on the top surface of said substrate and electrically connected to said external electrodes;
   a body of molding resin molded around said element part and to said top surface of said substrate; and
   a flow preventing member covering at least a portion of said through holes for preventing flow of molding resin into the portion of said through holes;
   wherein said molding resin is a material having low thixotropy, said body of molding resin has an upper surface which is coextensive with, and faces away from, said substrate and side surfaces which are coextensive with the periphery of said substrate, the entirety of said upper surface of said body of molding resin is flat, and the entirety of said side surfaces of said body of molding resin is flush with the entire periphery of said substrate.

2. An electronic part according to claim 1, wherein said through holes have axes which are perpendicular to the top surface of said substrate.

3. An electronic part according to claim 2, wherein said through holes are filled with conductive paste.

4. An electronic part according to claim 2, wherein said through holes are filled with solderable metal material.

5. An electronic part according to claim 2 wherein said flow preventing member is a covering member disposed between said top surface of said substrate and said body of molding resin for covering said through holes adjacent to said body of molding resin, and wherein said covering member is molded onto the top surface of said substrate by said molding resin, and said covering member has at least one side surface which is flush with the periphery of said substrate.

6. An electronic part according to claim 5 further comprising a pad disposed between said substrate and said element part and made of the same material as said covering member.

7. An electronic part according to claim 6 wherein said pad is penetrated by a hole, and further comprising a conductive member disposed in said hole in said pad for connecting said element part to a circuit region of said substrate.

8. An electronic part according to claim 5 wherein said covering member is an adhesive sheet, a dry film, a glass epoxy plate, or a ceramic plate.

9. An electronic part according to claim 5 wherein said external electrodes are disposed at corners of said substrate.

10. An electronic part according to claim 1 wherein said external electrodes are disposed at corners of said substrate.

* * * * *